US009703187B2

(12) United States Patent
Ono et al.

(10) Patent No.: US 9,703,187 B2
(45) Date of Patent: Jul. 11, 2017

(54) PELLICLE AND EUV EXPOSURE DEVICE COMPRISING SAME

(71) Applicant: MITSUI CHEMICALS, INC., Minato-ku, Tokyo (JP)

(72) Inventors: Yosuke Ono, Sodegaura (JP); Kazuo Kohmura, Iwakuni (JP)

(73) Assignee: MITSUI CHEMICALS, INC., Tokyo (JP)

( * ) Notice: Subject to any disclaimer, the term of this patent is extended or adjusted under 35 U.S.C. 154(b) by 44 days.

(21) Appl. No.: 14/893,314

(22) PCT Filed: May 20, 2014

(86) PCT No.: PCT/JP2014/002642
§ 371 (c)(1),
(2) Date: Nov. 23, 2015

(87) PCT Pub. No.: WO2014/188710
PCT Pub. Date: Nov. 27, 2014

(65) Prior Publication Data
US 2016/0147141 A1  May 26, 2016

(30) Foreign Application Priority Data

May 24, 2013 (JP) ................................ 2013-110042
Sep. 30, 2013 (JP) ................................ 2013-204242

(51) Int. Cl.
G03F 1/62 (2012.01)
G03F 1/24 (2012.01)
G03F 7/20 (2006.01)

(52) U.S. Cl.
CPC ................. *G03F 1/62* (2013.01); *G03F 1/24* (2013.01); *G03F 7/7015* (2013.01); *G03F 7/2004* (2013.01)

(58) Field of Classification Search
None
See application file for complete search history.

(56) References Cited

U.S. PATENT DOCUMENTS 4,932,331 A  6/1990 Kurihara et al.
5,793,836 A  8/1998 Maldonado et al.
(Continued)

FOREIGN PATENT DOCUMENTS

CN  1989069 A  6/2007
CN  102203907 A  9/2011
(Continued)

OTHER PUBLICATIONS

M. Bruna et al.: "Optical constants of graphene layers in the visible range," Applied Physics Letters, A I P. Publishing LLC, U.S., vol. 94, No. 3, Jan. 21, 2009, pp. 31901-31901.
(Continued)

*Primary Examiner* — Stephen Rosasco
(74) *Attorney, Agent, or Firm* — Buchanan, Ingersoll & Rooney PC

(57) ABSTRACT

The present invention addresses the problem of providing a pellicle which has high EUV transmittance and high strength, while being not susceptible to damage by heat. In order to solve the above-mentioned problem, the present invention provides a pellicle which comprises a pellicle film that has a refractive index (n) of light having a wavelength of 550 nm of 1.9-5.0 and a pellicle frame to which the pellicle film is bonded. The pellicle film has a composition that contains 30-100% by mole of carbon and 0-30% by mole of hydrogen. The intensity ratio of the 2D-band to the G-band, namely (intensity in 2D-band)/(intensity in G-band) is 1 or less, or alternatively, the intensity in the 2D-band and the intensity in the G-band are 0 in the Raman spectrum of the pellicle film.

14 Claims, 6 Drawing Sheets

(56) References Cited

U.S. PATENT DOCUMENTS

| | | |
|---|---|---|
| 2004/0071899 A1 | 4/2004 | Matsukura et al. |
| 2005/0040345 A1 | 2/2005 | Bakker et al. |
| 2008/0158535 A1 | 7/2008 | Goldstein et al. |
| 2008/0182180 A1* | 7/2008 | Brunner .................... G03F 1/62 430/5 |
| 2008/0254211 A1 | 10/2008 | Kurt et al. |
| 2009/0159840 A1 | 6/2009 | Oda et al. |
| 2011/0171566 A1 | 7/2011 | Hayashi |
| 2012/0045714 A1 | 2/2012 | Akiyama et al. |
| 2013/0088699 A1 | 4/2013 | Yakunin et al. |
| 2014/0160455 A1 | 6/2014 | Yakunin et al. |
| 2017/0017150 A1 | 1/2017 | Yakunin et al. |

FOREIGN PATENT DOCUMENTS

| | | |
|---|---|---|
| JP | 10-92743 A | 4/1998 |
| JP | 2000-284468 A | 10/2000 |
| JP | 2005-43895 A | 2/2005 |
| JP | 2009-116284 A | 5/2009 |
| JP | 2010-256434 A | 11/2010 |
| KR | 10-2004-0030261 A | 4/2004 |
| WO | WO 2011/160861 A1 | 12/2011 |

OTHER PUBLICATIONS

L.M. Malard et al: "Raman spectroscopy in graphene," Physics Reports, North-Holland, Amsterdam, NL, vol. 473, No. 5-6, Apr. 1, 2009, pp. 51-87.

Extended Search Report issued by the European Patent Office in corresponding European Patent Application No. 14801099.4 on Feb. 13, 2017 (9 pages).

International Search Report (PCT/ISA/210) mailed on Aug. 19, 2014, by the Japanese Patent Office as the International Searching Authority for International Application No. PCT/JP2014/002642.

Scaccabarozzi et al. "Investigation of EUV pellicle feasibility" Proceedings of SPIE, 2013, vol. 8679, 867904-1~867904-12, pp. 1-12.

Henke et al., "X-RAY Interactions: Photoabsorption, Scattering, Transmission, and Reflection At E = 50-30,000 eV, Z = 1-92", Atomic Data and Nuclear Data Tables 54, 1993, pp. 181-342.

\* cited by examiner

PELLICLE AND EUV EXPOSURE DEVICE COMPRISING SAME

TECHNICAL FIELD

The present invention relates to a pellicle, and an EUV exposure device containing the same.

BACKGROUND ART

High integration and miniaturization of semiconductor devices are advancing year after year in an accelerated manner. Currently, a pattern with a line width of about 45 nm is being formed by excimer exposure. However, nowadays, in accordance with the advance in the miniaturization of semiconductor devices, there is a demand for pattern formation with a line width of 32 nm or less. Fine processing for such pattern formation is difficult to be handled by the conventional excimer exposure. Therefore, use of shorter wavelength Extreme Ultra Violet (EUV) as the exposure light is being under consideration.

EUV has a property of being easily absorbed by every substance. Therefore, in an EUV lithography method, exposure is conducted in a catoptric system. Specifically, light exposure of a resist is performed by EUV reflected by an original plate having an exposure pattern reflected thereon. During such exposure, when foreign matters are attached to the original plate, exposure of a desired pattern becomes difficult due to EUV absorption or scattering by the foreign matters. Therefore, protection of the EUV irradiation surface of the original plate with a pellicle has been taken into consideration.

In addition, in the EUV lithography, contamination of an exposure device by scattering particles (debris) generated by the EUV light source. When the scattering particles (debris) are attached to an optical system, or scrape the EUV reflection surface, the efficiency of EUV irradiation becomes lowered. Further, when the scattering particles (debris) are attached to the original plate, as described above, the resist cannot be exposed in a desired pattern. Therefore, placement of a filter window in the EUV irradiation device, the filter window being a trap for the scattering particles (debris), has been taken into consideration.

The above-mentioned pellicle membrane and filter window are required to have (1) high transmittance of the EUV, and (2) resistance against decomposition/deformation by the EUV irradiation. As the pellicle membrane or filter that satisfies such requirements, a membrane composed of a monocrystalline silicon (PTLs 1 and 2), an aluminum nitride film laminated on a metal mesh (PTL 3), a graphene film (PTL 4), and the like are proposed.

CITATION LIST

Patent Literature

PTL 1
Japanese Patent Application Laid-Open No. 2010-256434
PTL 2
Japanese Patent Application Laid-Open No. 2009-116284
PTL 3
Japanese Patent Application Laid-Open No. 2005-43895
PTL 4
WO2011/160861

SUMMARY OF INVENTION

Technical Problem

When the EUV is irradiated on a pellicle membrane, a part of its energy is absorbed by the pellicle membrane. Then, the EUV energy absorbed by the membrane is converted into heat through various relaxation processes. Accordingly, the temperature of the pellicle membrane rises during EUV exposure. Thus, the pellicle membrane is also required to have a high heat dissipation property and heat resistance. However, the above-mentioned monocrystalline silicon film has lower heat dissipation property and also has a lower melting point. Therefore, this film was accompanied by a problem of being easily damaged during EUV irradiation. Other disadvantages of the monocrystalline silicon film are complicated manufacturing processes and high cost.

The aluminum nitride film of PTL 3 has low EUV transmittance, and thus is not suitable for a lithographic application that requires high EUV transmittance. The graphene film of PTL 4 is an aggregate of small (typically about 100 to 1,000 nm) crystals. Therefore, the film is brittle and has insufficient durability. Furthermore, sufficient strength could not be achieved by multiple lamination of such graphene.

The present invention has been achieved in view of such circumstances. It is an object of the present invention to provide a pellicle with a membrane having high EUV transmittance and high heat resistance as well as excellent durability.

Solution to Problem

That is, a first aspect of the present invention relates to the following pellicle:

[1] A pellicle including a pellicle membrane having a refractive index n of 1.9 to 5.0 under light with a wavelength of 550 nm, and a pellicle frame to which the pellicle membrane is adhered, in which the pellicle membrane contains in its composition 30 to 100% by mole of carbon and 0 to 30% by mole of hydrogen, and, in a Raman spectrum of the pellicle membrane, an intensity ratio between a 2D-band and a G-band (intensity of 2D-band/intensity of G-band) is 1 or less, or an intensity of each of the 2D-band and the G-band is 0.

[2] The pellicle according to [1], in which the pellicle membrane further contains 0 to 70% by mole of a third component selected from the group consisting of Si, B, N, O, Y, Zr, Nb and Mo, and a total of the carbon, the hydrogen and the third component is 98% by mole or more.

[3] The pellicle according to [2], containing 40 to 60% by mole of Si as the third component.

[4] The pellicle according to [2] or [3], in which the pellicle membrane contains a polycrystalline silicon carbide film, and a density of the pellicle membrane is within a range of from 3.0 to 5.0 g/cm$^3$.

[5] The pellicle according to any one of [1] to [3], in which the pellicle membrane contains at least one film selected from the group consisting of a diamond-like carbon film, an amorphous carbon film, a graphite film and a silicon carbide film.

[6] The pellicle according to any one of [1] to [5], in which a thickness of the pellicle membrane is 10 to 120 nm.

[7] The pellicle according to any one of [1] to [6], in which the pellicle membrane is obtained by imparting high energy to a polymer film.

[8] The pellicle according to [7], in which the polymer film is a polyimide film.

A second aspect of the present invention relates to the following EUV exposure device, or the like.

[9] An EUV exposure device including an EUV light source, an optical system, and an original plate, in which light from the EUV light source is guided to the original plate through the optical system, and the pellicle according to any one of [1] to [8] is provided on a light incidence surface of the original plate.

[10] An exposure original plate including an original plate, and the pellicle according to any one of [1] to [8] attached to the original plate.

[11] An exposure method including: irradiating EUV on the original plate by passing the EUV from an EUV light source through the pellicle membrane of the exposure original plate according to [10], and passing through the pellicle membrane the EUV reflected by the original plate and irradiating a sensitive substrate with the EUV, to thereby expose the sensitive substrate in a pattern.

Advantageous Effects of Invention

According to the present invention, it is possible to securely inhibit foreign matters from being attached to an original plate during EUV irradiation.

DESCRIPTION OF EMBODIMENTS

1. Pellicle

In the present invention, EUV means light having a wavelength of 5 to 30 nm. That is, the exposure light of EUV lithography is light having a wavelength of 5 to 30 nm, and more preferably light having a wavelength of 5 to 13.5 nm.

Figure 1:
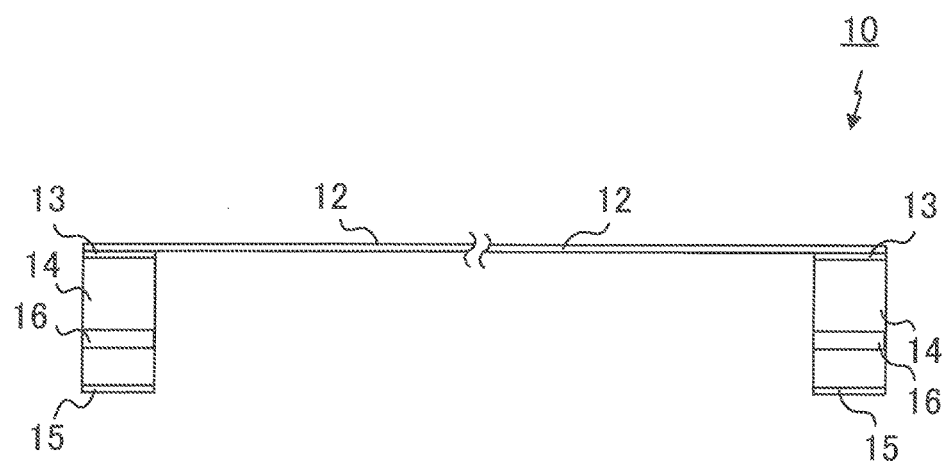
FIG. 1 is a schematic sectional view illustrating an example of a pellicle of the present invention.

As illustrated in FIG. 1, the pellicle 10 of the present invention (hereinafter, sometimes referred to as "pellicle 10") includes pellicle membrane 12, and pellicle frame 14 to which the pellicle membrane 12 is adhered. Pellicle membrane 12 is stretched on pellicle frame 14 through film adhesive layer 13 or the like. In pellicle 10 of the present invention, pellicle membrane 12 may be laminated with an antioxidant layer (not illustrated). In addition, pellicle 10 may include original plate adhesive layer 15 for adhering pellicle frame 14 to an original plate (not illustrated).

1-1. Pellicle Membrane

The above-mentioned pellicle membrane may be composed of either a single membrane, or a laminate of two or more membranes. In addition, the pellicle membrane may be a membrane having its entire surface supported by a supporting material, but is preferably a membrane which can maintain its membrane shape by itself (self-supporting membrane).

The pellicle membrane has a refractive index n of 1.9 to 5.0 under light with a wavelength of 550 nm. It is sufficient that the pellicle membrane contains, in its entire composition, 30 to 100% by mole of carbon and 0 to 30% by mole of hydrogen. In addition, the pellicle membrane may further contain 0 to 70% by mole of a third component (an element selected from the group consisting of Si, B, N, O, Y, Zr, Nb and Mo). The total of the carbon, the hydrogen and the third component in the composition of the pellicle membrane is preferably 98% by mole or more. That is, a small amount of a component other than the carbon, the hydrogen and the third component may be contained in the composition, but the total of the carbon, the hydrogen and the third component is preferably 100%. The above-mentioned refractive index is measured by an ellipsometer. In addition, the composition of the pellicle membrane is measured by Rutherford Backscattering Spectrometry (RBS) method and X-ray Photoelectron Spectroscopy (XPS) method.

In addition, in a Raman spectrum of the pellicle membrane, the ratio (I(2D)/I(G)) between the intensity of G-band (I(G)) and the intensity of 2D-band (I(2D)) is 1 or less, or the intensity of each of the 2D-band and the G-band is 0. In a Raman spectrum of a silicon carbide film, the intensity of each of the 2D-band and the G-band sometimes cannot be measured. That is, the intensity of each of the 2D-band and the G-band is sometimes 0. The phrase "ratio (I(2D)/I(G)) between the intensity of G-band (I(G)) and the intensity of 2D-band (I(2D)) is 1 or less" means that no graphene film is contained in the pellicle membrane. As described above, the graphene film is brittle, and thus the strength of the membrane is difficult to be increased by laminating the graphene film.

Here, the Raman spectrum is preferably observed using a Raman microscope. The observation with the Raman microscope is conducted as follows. Laser light is made incident on a beam splitter, and the laser light reflected by the beam splitter is narrowed down to a beam diameter of about 1 μm with an objective lens for an optical microscope. Then, the laser light having the adjusted beam diameter is irradiated on a sample in a vertical direction. Raman scattered light caused by the laser light irradiation on the sample is condensed by the above-mentioned objective lens, and the condensed light is made incident to a spectroscope through the beam splitter or an aperture. Although the position for measuring the Raman spectrum is not particularly limited, the measurement is preferably made at a portion of the membrane having high membrane smoothness and also uniform membrane thickness and surface conditions on a laser-irradiated side thereof. Raman microscope typically uses an X-Y motor-driven stage, and thus, a mapping measurement or a multipoint measurement is possible. Accordingly, when the pellicle membrane has a carbon structure distribution, the multipoint measurement may be conducted, and when there is no distribution, measurement may be made at only a single point. The wavelength of the laser light to be used for Raman spectroscopy is not particularly limited. Examples of the typical wavelength of the laser light include 1,064 nm, 633 nm, 532 nm, 515 nm, 502 nm, 496 nm, 488 nm, 477 nm, 473 nm, 466 nm, 458 nm, 364 nm, and 351 nm.

A single-layered graphene is typically composed of an aggregate of small (typically about 100 to 1,000 nm) crystals, and a Raman spectrum is observed at around 1,590 $cm^{-1}$ and at 2,800 to 2,600 $cm^{-1}$. The spectrum around 1,590 $cm^{-1}$ is called G-band, and is a spectrum observed commonly in an sp2 hybrid orbital. On the other hand, a spectrum observed at 2,800 to 2,600 $cm^{-1}$ is called 2D-band. The ratio between the intensity of the 2D-band (I(2D)) and the intensity of the G-band (I(G)) is: I(2D)/I(G)>1 in the singled-layered graphene. Membrane strength of such a membrane is poor and has insufficient durability, and thus cannot be used as a pellicle membrane. In addition, a membrane obtained by multiple lamination of such graphene does not have regularity in the c-axis direction as seen in the below-described graphite film. Accordingly, the laminated graphene does not acquire sufficient film strength, and thus cannot be used as a pellicle membrane.

On the other hand, materials such as a diamond-like carbon film, an amorphous carbon film, a graphite film and a silicon carbide film having sufficient film thickness and strength have relatively large intensity of the G-band compared with the intensity of the 2D-band, and thus it follows that I(2D)/I(G)<1. Therefore, these films can be used as a pellicle membrane.

Examples of films that satisfy the above-mentioned refractive index and composition, as well as the intensity ratio in the Raman spectrum, include a diamond-like carbon film (hereinafter also referred to as "DLC film"), an amorphous carbon film, and a graphite film.

1-1-1. Diamond-Like Carbon Film

The diamond-like carbon has an intermediate crystalline structure between diamond and graphite; and has an amorphous structure in which sp3 bonds and sp2 bonds are present in a mixed manner. That is, the DLC film has no clear crystal grain boundary, and is likely to be a tenacious film. The DLC film may be (i) a film not containing hydrogen in its structure (ta-C (tetrahedral amorphous carbon)), (ii) a film containing hydrogen in its structure (a-C:H (hydrogenated amorphous carbon)), or (iii) a film doped with the above-mentioned third component.

(i) The DLC (ta-C) film not containing hydrogen in its structure may be a film composed only of carbon, and having a refractive index of 2.4 to 2.6 under light with a wavelength of 550 nm.

The DLC (ta-C) film may be a film formed by a known film-forming method. Examples of the methods of producing the DLC film include CVD methods, such as a thermal CVD method, a plasma CVD method, and a plasma-based ion implantation and deposition (PBIID) method; and PVD methods, such as a sputtering method, an ion plating method, and a Filtered Cathodic Vacuum Arc (FCVA) method.

(ii) The DLC (a-C:H) film containing hydrogen contains in its composition 70 to 90% by mole of carbon and 10 to 30% by mole of hydrogen. The total of carbon and hydrogen in the composition is 98% by mole or more. In addition, the DLC (a-C:H) film typically does not contain the third component. The refractive index of the DLC (a-C:H) film under light with a wavelength of 550 nm is typically 1.9 to 2.5.

The composition and the refractive index of the DLC (a-C:H) film are adjusted by the hydrogen content; and for example, the hardness and the durability of the film changes in accordance with the hydrogen content. A DLC (a-C:H) film having low hydrogen content has high strength, and is a film stable to EUV. On the other hand, a DLC (a-C:H) film having high hydrogen content has flexibility, and is a film which is difficult to suffer crack formation. The hydrogen content of the diamond-like carbon film is, as described above, determined by Rutherford Backscattering Spectrometry (RBS) method, Hydrogen Forward Scattering Spectroscopy (HFS), or Fourier Transformation Infrared Spectroscopy (FT-IR) method.

The DLC (a-C:H) film may be a film formed by a known film-forming method. Examples of the methods of producing the DLC (a-C:H) film include CVD methods, such as a thermal CVD method, a plasma CVD method, and a plasma-based ion implantation and deposition (PBIID) method; and PVD methods, such as a sputtering method, an ion plating method, and a Filtered Cathodic Vacuum Arc (FCVA) method.

(iii) The DLC film doped with the third component (one element or two or more elements selected from Si, B, N, O, Y, Zr, Nb and Mo) (hereinafter, also referred to as "third component-doped DLC film") desirably contains 0.1 to 70% by mole of the third component.

Doping of a DLC film with the third component leads to enhanced heat resistance of the DLC film, enhanced adhesiveness between the film and the supporting material, and reduced stress against the film during the production of the DLC film. In particular, when the third component is Y, Zr, Nb or Mo, the pellicle membrane is likely to exhibit enhanced transmittance for EUV with 13.5 nm.

The DLC film doped with Si is formed by the CVD method, in which an organic silicon-based gas and a hydrocarbon gas are introduced into a film-forming chamber. An example of the organic silicon-based gas includes trimethylsilane gas (TMS). The amount of silicon to be doped is controlled, for example, by the flow rate ratio between the organic silicon-based gas and the hydrocarbon gas.

The DLC film doped with B is formed by the CVD method, in which an organic boron-based gas and a hydrocarbon gas are introduced into a film-forming chamber. An example of the organic boron-based gas includes trimethylboron gas. The amount of boron to be doped is controlled, for example, by the flow rate ratio between the organic boron-based gas and the hydrocarbon gas.

The DLC film doped with N and O is formed by the CVD method, in which a nitrogen gas, an oxygen gas and a hydrocarbon gas are introduced into a film-forming chamber. The amounts of N and O to be doped are controlled, for example, by the flow rate ratio between the nitrogen and the oxygen gases and the hydrocarbon gas.

The DLC film doped with Y, Zr, Nb or Mo is formed by PVD methods, such as a sputtering method, an ion plating method, and a Filtered Cathodic Vacuum Arc (FCVA) method, in which graphite and a metal to be doped are used as target materials.

1-1-2. Amorphous Carbon Film

The amorphous carbon film may be a film composed only of carbon, and having a refractive index of 1.9 to 2.1 under light with a wavelength of 550 nm. The amorphous carbon film is composed of an amorphous structure constructed mainly from sp2 bonds.

The amorphous carbon film may be film formed by a vacuum deposition method, and specifically a film obtained by depositing on a supporting material, a vaporized material (carbon) generated from a vapor source under a pressure of about $10^{-2}$ to $10^{-4}$ Pa. In the vacuum deposition method, in general, the energy of the vaporized particles is relatively small as 0.1 to 1 eV, and thus the film is likely to be porous. Accordingly, the amorphous carbon film formed by the vacuum deposition method has lower density, and thus has high EUV transmittance even when the film is thick.

1-1-3. Graphite Film

The graphite film may be a film composed only of carbon, and having a refractive index of 2.0 to 3.0 under light with a wavelength of 550 nm.

Figure 2:
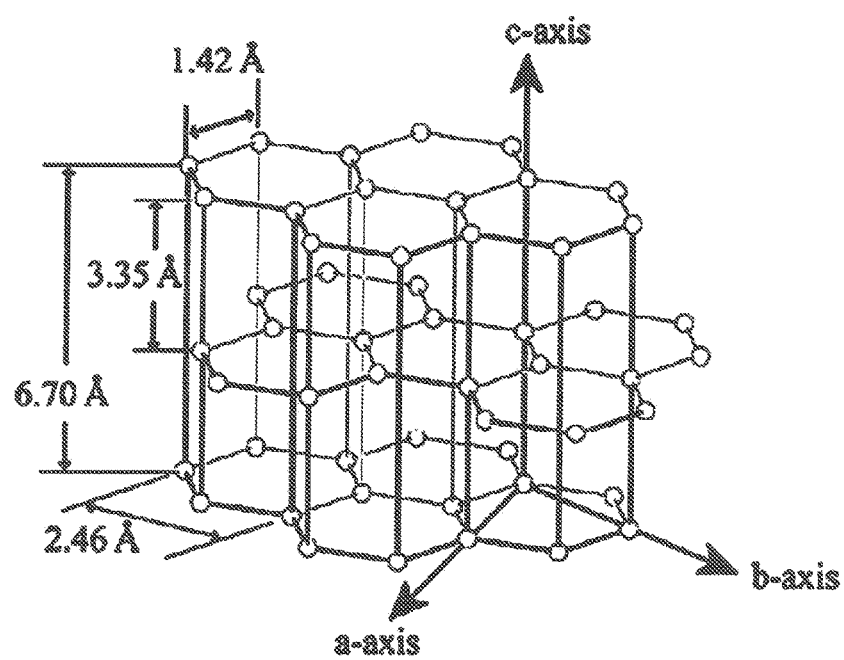
FIG. 2 is an explanatory drawing illustrating a crystalline structure of graphite.

FIG. 2 is a schematic diagram of the crystalline structure of graphite. As illustrated in FIG. 2, the graphite crystal has a structure in which a plurality of structures formed by linked six-membered rings of sp2-bonded carbon atoms are layered in the c-axis direction. In the present invention, only a compound in which the structures formed by linked six-membered rings are regularly arranged in the c-axis direction is considered as the graphite; whereas a material, such as a laminate of graphene, which does not have the structures regularly arranged in the c-axis direction is not included in the definition of graphite. The graphite may contain N, Si, an sp3 carbon atom, or the like as a part thereof.

The graphite film may be either a film having a monocrystalline structure, or a film having a polycrystalline structure. The graphite film having the monocrystalline structure is preferred in terms of high film strength and high thermal conductive property. On the other hand, the graphite film having the polycrystalline structure is easy to manufacture, and is preferred in terms of cost.

In addition, the mosaic spread of the graphite film is preferably 5.0 or less, more preferably 0.1 or more and 3.0 or less, and even more preferably 0.1 or more and 1.0 or less. When the mosaic spread is 5.0 or less, the film has excellent strength and heat dissipation property. The mosaic spread is an index indicating the degree of c-axis orientation of crystallites in the graphite film. The smaller the mosaic spread, the higher is the degree of the c-axis orientation of the crystallites. When the value of the mosaic spread is large, i.e., when the degree of the c-axis orientation of the crystallites in the graphite film is low, it becomes difficult to regularly arrange in the c-axis direction the structures formed by the linked six-membered rings, and the resultant graphite film becomes brittle.

For example, the phrase "mosaic spread is 0.3°" means that the deviation of the c-axis from the direction vertical to the structure formed by the linked six-membered rings (plate plane) is approximately within ±0.6° (Ka-bon Yo-go Jiten (Carbon Term Dictionary), the Carbon Society of Japan, Carbon Term Dictionary Editorial Board, Keiichi Yasuda, Kazuo Kobayashi, Agune Syo-fu Sya, 2000). The mosaic spread is adjusted by the temperature and pressure used in the calcination process for producing the graphite film.

The mosaic spread is measured by the following procedures using an X-ray diffraction apparatus. A counter (2θ axis) of the X-ray diffraction apparatus is fixed at a position where a peak is observed in an X-ray diffraction curve for (002) plane of a plate-like graphite film. Then, an intensity function (a sample azimuth-dependent curve of a peak intensity of (002) plane diffraction curve) is measured by rotating only a sample (θ axis). A half value of the peak intensity is determined from the obtained intensity function, and the half value is employed as the mosaic spread.

The above-mentioned graphite film may be a film formed by known methods. Examples of the methods of forming the graphite film include a method of imparting high energy to a polymer film made of polyoxadiazol, aromatic polyimide, aromatic polyamide, polybenzimidazole, polybenzobisthiazole, polybenzoxazole, polythiazole, polyacrylonitrile, polyparaphenylene vinylene or the like, to thereby transform the polymer into graphite. The method of imparting high energy is preferably calcination at high temperature, or irradiation of radioactive rays. The radioactive ray to be irradiated may be an X-ray, a γ-ray, an electron ray, a neutron ray, an ion beam (heavy charged particle beam), or the like. When a radioactive ray is radiated to a polymer film, the radioactive ray interacts with a substance constituting the film and imparts energy to atoms in the film. This energy causes various chemical reactions, such as excitation of atoms, ionization of atoms, and emission of secondary electrons. As a result, the polymer film is carbonized to afford a graphite film. In addition, examples of the methods of producing the graphite film also include an arc discharging method using solid carbon as a raw material, a plasma chemical vapor deposition (CVD) method using a hydrocarbon-based gas as a raw material, and a vacuum plasma jet method using a methane gas as a raw material.

The graphite film is preferably a highly oriented pyrolytic graphite (HOPG) obtained by forming a film by the above-mentioned methods, and then further reannealing the formed film for a long period of time at high temperature under pressure. The highly oriented pyrolytic graphite obtained by reannealing for a long period of time has extremely small mosaic spread.

Here, when the graphite film is employed as the pellicle membrane, the graphite film obtained by the above-mentioned method needs to be thin layered. An example of a method of thin layering the graphite film includes a method in which a physical force is applied to the graphite film for cleavage thereof.

1-1-4. Silicon Carbide Film

The silicon carbide film is a film containing carbon and silicon, and may be either an amorphous film or a crystalline film.

The amorphous silicon carbide film may be a film containing, in its structure, not only heteroatomic bonding, such as Si—C, C—H and Si—H, but also homoatomic bonding, such as C—C and Si—Si. The amorphous silicon carbide film contains, in its composition, 30 to 99% by mole of carbon, 0 to 30% by mole of hydrogen, and 1 to 70% by mole of silicon; and hydrogen is not requisite. The silicon carbide film more preferably contains, in its composition, 40 to 60% by mole of carbon, 0 to 30% by mole of hydrogen, and 40 to 60% by mole of silicon. As the third component, atoms such as B, N, O, Y, Zr, Nb and Mo may be contained. The content of the third component together with Si is desirably 1 to 70% by mole, and more desirably 40 to 60% by mole. In addition, the total of the carbon, the hydrogen and the third component in the composition is 98% by mole or more.

From the viewpoint of increasing the EUV transmittance and of increasing the stability to EUV and the heat resistance, it is particularly preferable that 80 to 85% by mole of carbon and 15 to 20% by mole of silicon are contained (the total of the carbon and the silicon is 100% by mole) in the composition of the amorphous silicon carbide film.

The amorphous silicon carbide film may be a film formed by an ion plating method. The adhesiveness between an obtained film and a supporting material is adjusted by changing the voltage used for film formation, and the heating temperature and gas pressure applied to a film-forming body in the ion plating method.

On the other hand, a crystalline silicon carbide film is a film containing a crystalline structure composed of Si—C heteroatomic bonding. The silicon carbide film may have either a monocrystalline structure, or a polycrystalline structure. The crystalline silicon carbide film contains, in its composition, 30 to 99% by mole of carbon, 0 to 30% by mole of hydrogen, and 1 to 70% by mole of silicon; and hydrogen is not requisite. The silicon carbide film more preferably contains, in its composition, 40 to 60% by mole of carbon, 0 to 30% by mole of hydrogen, and 40 to 60% by mole of silicon. As the third component, atoms such as B, N, O, Y, Zr, Nb and Mo may be contained. The content of the third component together with Si is desirably 1 to 70% by mole, and more desirably 40 to 60% by mole. In addition, the total of the carbon, the hydrogen and the third component in the composition is 98% by mole or more.

The density of the pellicle membrane containing the polycrystalline silicon carbide film is preferably within the range of from 3.0 to 5.0 g/cm$^3$. While the density of the polycrystalline silicon carbide film itself is about 3.3 g/cm$^3$, the density of the pellicle membrane which is a laminate of the polycrystalline silicon carbide film and other layers is preferably within the above-mentioned range.

The crystalline silicon carbide film may be a film formed by known methods. Examples of the method of forming the crystalline silicon carbide film include an atmospheric pressure plasma CVD method, low pressure CVD (LPCVD) method, and an AC plasma-assisted CVD method. An organic silicon-based gas and a hydrocarbon gas are introduced into a film-forming chamber in the CVD method to form a film. Examples of the organic silicon-based gas include a monosilane gas and a dichlorosilane gas. Crystallinity and film thickness can be controlled by changing the conditions, such as substrate temperature, gas flow rate, pressure and plasma power. For example, raising the substrate temperature can increase crystallinity, and lowering gas pressure by pressure reduction can lower the mean free path of atoms and molecules, thereby increasing the coatability during film formation and the film thickness uniformity of the formed film.

1-1-5. Supporting Material for Pellicle Membrane

As described above, the pellicle membrane may have a supporting material. The supporting material for supporting the pellicle membrane may be disposed either on an original plate side of the pellicle membrane, or on the side of an EUV incidence surface of the pellicle membrane. In addition, the pellicle membrane may be embedded in gaps between mesh-like supporting materials. Examples of the supporting material include a mesh-like substrate made of silicon, a metal, or the like, and a metal wire.

The ratio of the area of the supporting material to the area of the inner region of the pellicle frame is preferably 20% or less, more preferably 15% or less, and even more preferably 10% or less. When the area of the supporting material is more than 20%, the EUV transmittance becomes lowered, causing the efficiency of EUV irradiation to be lowered.

The shape of the supporting material is not particularly limited. A honeycomb shape, a quadrangular shape, a triangular shape, or a shape in which polygons are combined may be employed. In order to prevent the formation of a shade during exposure, the size of a repeating unit of the supporting material is preferably as small as possible. In addition, in order to increase the aperture ratio, it is preferred that the width of the supporting material is as small as possible within a range where the mechanical strength of the supporting material is maintained. Preferably, the size of a polygonal repeating unit of the supporting material is 10 to 500 μm, and the width of the supporting material is 0.1 to 50 μm; more preferably the size of the polygonal repeating unit is 10 to 200 μm, and the width of the supporting material is 0.1 to 20 μm; and still more preferably the size of the polygonal repeating unit is 10 to 50 μm, and the width of the supporting material is 0.1 to 1 μm.

The thickness of the supporting material is desirably as small as possible within a range where the mechanical strength of the supporting material is maintained. The EUV light is irradiated on an EUV pellicle membrane at an inclination angle of about 6° and is transmitted through the EUV pellicle membrane. The transmitted light is irradiated at an EUV mask and is reflected again to the EUV pellicle at an inclination angle of about 6°. Accordingly, in order to reduce an area of EUV light blockage by the supporting material, a thin supporting material is desirable. The thickness of the supporting material is desirably 0.1 to 500 μm, more desirably 0.1 to 200 μm, and further desirably 0.1 to 20 μm.

The method of producing the supporting material of the pellicle membrane is not particularly limited. Examples of such methods include a method in which metal wires are intertwined to produce a meshed supporting material, a method in which a substrate is shaven by etching to produce a supporting material, and a method in which a supporting material is produced by producing a mold of a supporting material by lithography or imprint, and embedding a metal into the mold by means of plating.

As an example of a method for producing the supporting material by shaving the substrate by etching, there can be mentioned an etching of a metal substrate, such as aluminum or a stainless steel substrate. In the etching, the substrate may be either shaved mechanically, or shaved by laser irradiation. When the supporting material is produced by etching a silicon substrate, the shape of the supporting material is patterned on the photoresist, followed by anisotropic etching, such as dry etching or wet etching. The light source to be used for the pattering can be selected arbitrarily in accordance with the size of the polygonal repeating unit or the width of the supporting material. For example, visible lights, such as D-ray and I-ray, ultraviolet rays, such as KrF and ArF excimer lasers, X-rays, electron rays, and the like may be used.

A supporting material may be produced with the pellicle membrane being placed thereon, or alternatively a produced supporting material may be adhered to the membrane.

1-1-6. Method of Manufacturing Pellicle Membrane which is Self-Supporting Membrane While the methods of producing the pellicle membrane not having a supporting material (self-supporting membrane) are not particularly limited, examples of the manufacturing methods will be set forth hereinafter.

1-1-6-1. Method of Laminating Sacrificial Layer on Substrate and Removing the Sacrificial Layer A self-supporting membrane can be obtained by laminating a sacrificial layer on a substrate, forming a pellicle membrane thereon, and removing the sacrificial layer. The sacrificial layer can be any material, such as metal, oxide film, resin, or salt which can be removed by a specific treatment method. For example, the sacrificial layer may be a metal, such as aluminum which dissolves in an acid solution. Specifically, a metal layer is laminated on the surface of a glass substrate or silicon wafer by vapor deposition or sputtering, and a pellicle membrane is further laminated on the metal layer, followed by immersing the resultant laminate in a solution, such as an acid solution, capable of melting the metal layer, thereby enabling the pellicle membrane to be peeled off from the substrate.

When a silicon wafer having a natural oxide film or a silicon oxide layer is used as a substrate, a pellicle membrane can be obtained by coating a pellicle membrane on the silicon wafer, immersing the resultant silicon wafer in an aqueous hydrofluoric acid solution, and removing the natural oxide film or silicon oxide layer for peeling off the pellicle membrane from the substrate.

The sacrificial layer to be laminated on the substrate may be a water-soluble material, such as a partially saponified polyvinyl alcohol resin, or a salt, such as sodium chloride. After laminating the pellicle membrane on the sacrificial layer, the laminate can be immersed in water, to thereby peel off the pellicle membrane from the substrate.

When selecting a method of removing the sacrificial layer laminated on the substrate, a most appropriate method can be selected arbitrary depending on the features, such as process resistance and film strength of the pellicle membrane, and removal rate, uniformity in film thickness and surface roughness of the sacrificial layer.

1-1-6-2. Method of Etching or Dissolving Substrate

When materials, such as metal, oxide film, resin and salt, that can be removed by a specific treatment method are used for the substrate, a pellicle membrane can be obtained by laminating a pellicle membrane on the substrate, and subsequently etching or dissolving the substrate.

For example, when using copper foil as the substrate, a pellicle membrane is laminated on the surface of the copper foil, and the resultant laminate is immersed in a cupric chloride etching solution to thereby etch away the copper foil substrate and peel off the pellicle membrane from the substrate.

When using a glass substrate as the substrate, a pellicle membrane is laminated on the glass substrate, and the glass is etched away using hydrofluoric acid, to thereby peel off the pellicle membrane from the glass substrate.

When using a silicon wafer as the substrate, a pellicle membrane is laminated on the silicon wafer, and the silicon wafer is etched away by wet etching or dry etching to thereby peel off the pellicle membrane from the silicon wafer. For the wet etching, an etching solution such as KOH, TMAH or hydrazine can be used. For the dry etching, an etching gas such as a fluorine-based gas ($SF_6$, $CF_4$, $NF_3$, $PF_5$, $BF_3$, $CHF_3$), a chlorine-based gas ($Cl_2$, $SiCl_4$), or a bromine-based gas (IBr) can be used. Since the wet etching rate varies depending on the temperature, for etching without causing damage to the thin pellicle membrane on the silicon wafer, the liquid temperature is lowered to reduce the etching rate.

For dry-etching the silicon wafer, a layer such as an etching stop layer may be provided in advance on the surface of the silicon substrate. Examples of the etching stop layers include $SiO_2$ and SiN. The etching stop layer is preferably a film that imparts tensile stress to the pellicle membrane. The residual stress applied to the substrate and the surface of the thin film in the parallel direction includes tensile stress and compressive stress. The force which acts to expand the thin film from the inside of the thin film is tensile stress, and the force which acts to contract the thin film from the inside of the thin film is compressive stress. These stresses are mainly imparted during the film-forming process of the thin film. One reason for the residual stress is the difference in the coefficient of thermal expansion between the substrate and the thin film. Both the substrate and the thin film contract when the temperature is returned to room temperature, but the ratio of contraction differs depending on the coefficient of thermal expansion. When the coefficient of thermal expansion of the thin film is greater than that of the substrate, tensile stress is imparted, and compressive stress is imparted when the relationship is the other way around. When the tensile stress is imparted to the thin film, tension is applied to the thin film, and enables a formation of an unwrinkled film. On the other hand, when the compressive stress is imparted to the thin film, the thin film is likely to suffer warpage and wrinkles. Since an SiN film is a film that imparts tensile stress, when the SiN layer is used as the etching stop layer, a pellicle membrane obtained by dry-etching the silicon wafer can be an unwrinkled film. The etching stop layer is removed after completion of the dry-etching of the silicon wafer, and thus a desired self-supporting membrane composed only of the pellicle membrane can be obtained.

When using a substrate made of a salt, such as sodium chloride, the pellicle membrane is laminated on the surface of the substrate, and the resultant laminate is immersed in water to etch away the substrate, thereby peeling off the pellicle membrane from the substrate. When using a plastic substrate, the pellicle membrane is laminated on the surface of the plastic substrate, and the resultant plastic substrate is immersed in a solvent capable of dissolving the plastic substrate, thereby peeling off the pellicle membrane from the plastic substrate.

1-1-6-3. Method of Applying Pretreatment to Surface of Substrate for Easy Peeling-Off of the Film Application of a surface treatment to the substrate enables the control of the interaction between the pellicle membrane and the substrate surface, and enables an easy peeling off of the pellicle membrane from the substrate through immersion in a solvent or mechanical peeling off. Examples of the method of controlling the interaction between the pellicle membrane and the substrate surface include a surface treatment method using a silane coupling agent. Other methods include a method of washing the substrate surface with water, an organic solvent, piranha solution, sulfuric acid, a UV ozone treatment, or the like. When the silicon wafer is employed as the substrate, a solution used in an RCA washing method, such as a liquid mixture of aqueous hydrogen peroxide and ammonium hydroxide, a liquid mixture of hydrochloric acid and hydrogen peroxide water, or the like can be used.

Formation of the sacrificial layer and the surface treatment of the substrate can be combined with the method of etching or dissolving the substrate. A substance to be used for the sacrificial layer and the surface treatment is preferably a substance which does not easily remain on the surface of or inside the pellicle membrane, or which residues can be removed by an easy method. Examples of the methods for removing the residues include etching by gas, evaporation by heat, washing with a solvent, and decomposition/removal by light; and a combination thereof.

1-1-7. Physical Properties of Pellicle Membrane 1-1-7-1. Heat Dissipation Property and Heat Resistance As described above, during EUV irradiation, energy of the EUV light is converted into heat through various relaxation processes. Therefore, the pellicle membrane is required to have heat dissipation property and heat resistance. However, conventional monocrystalline silicon films have a problem of lower heat dissipation property, and suffer deformation or breakage due to thermal damage during the EUV irradiation.

In contrast, all of the above-mentioned DLC film, amorphous carbon film, graphite film and silicon carbide film have both the heat dissipation property and the heat resistance, and thus have a low risk of breakage of the pellicle membrane during EUV lithography. Accordingly, users of such films enable secure protection of the original plate with the pellicle membrane. The reason why the above-mentioned DLC film, amorphous carbon film, graphite film and silicon carbide film have both the heat dissipation property and the heat resistance will be explained below.

The heat dissipation property of the pellicle membrane is determined mainly by (i) radiation property (release of energy by infrared ray) of the pellicle membrane, and (ii) thermal conductive property of the pellicle membrane.

(i) The relationship (1) below is established between emissivity ϵ (radiation property) of the pellicle membrane, and temperature T of the pellicle membrane during EUV irradiation, EUV irradiation intensity P, EUV transmittance Tr of the pellicle membrane, Stefan-Boltzmann constant σ and wall temperature Tw (temperature inside EUV irradiation apparatus). It is to be noted that, in the relationship (1), the thermal conductive property of the pellicle membrane is set to 0.

$$T = \left( \frac{P \cdot (1 - Tr)}{\varepsilon \cdot \sigma} + T_W^4 \right)^{1/4} \qquad (1)$$

Figure 3:
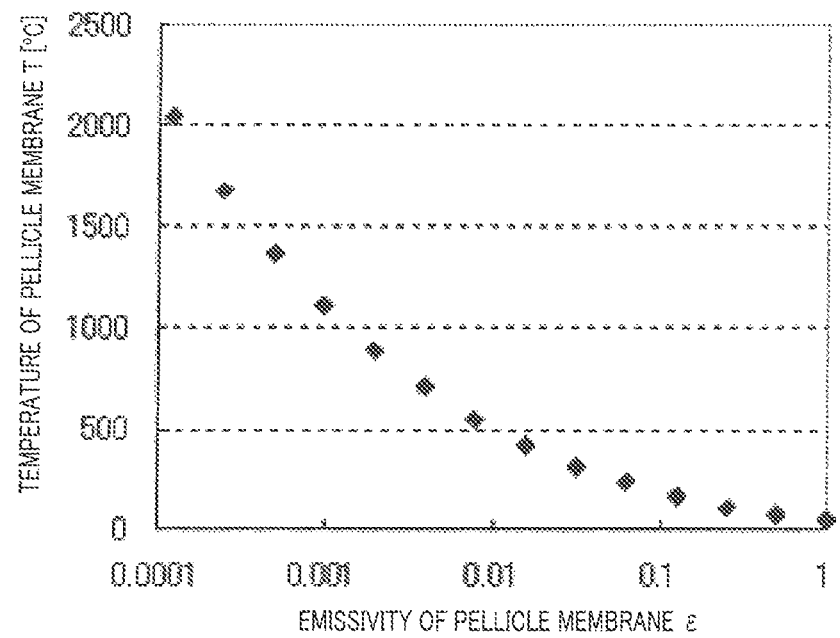
FIG. 3 is a graph illustrating the relationship between temperature T of a pellicle membrane and emissivity ϵ of the pellicle membrane.

FIG. 3 is a graph illustrating the relationship between "temperature T of pellicle membrane" and "emissivity ϵ of pellicle membrane" obtained by the above relationship (1); in this graph, the EUV transmittance Tr of the pellicle membrane is set at 80%, and the EUV irradiation intensity P is set at 100 W/cm². As illustrated in FIG. 3, it is apparent that the larger the emissivity ϵ of the pellicle membrane becomes, the lower the temperature T of the pellicle membrane becomes.

Figure 4:
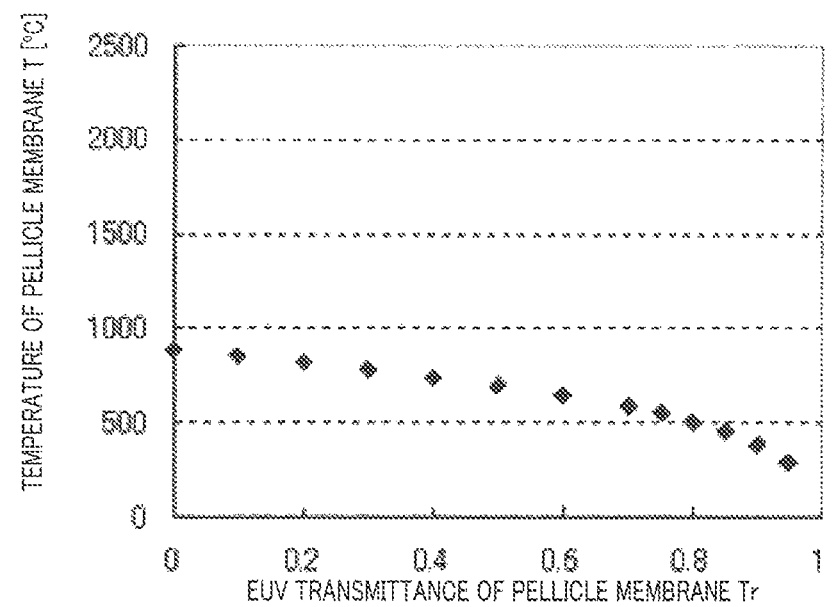
FIG. 4 is a graph illustrating the relationship between temperature T of the pellicle membrane and EUV transmittance Tr of the pellicle membrane.

On the other hand, FIG. 4 is a graph illustrating the relationship between "temperature T of pellicle membrane" and "EUV transmittance Tr of pellicle membrane" obtained by the above relationship (1); in this graph, the emissivity ϵ of the pellicle membrane is set at 0.01, and the EUV irradiation intensity P is set at 100 W/cm². As illustrated in FIG. 4, variation in the EUV transmittance Tr of the pellicle membrane results in some change in the temperature T of the pellicle membrane, but this change is small. That is, the temperature T of the pellicle membrane hardly depends on the EUV transmittance Tr of the pellicle membrane, but depends largely on the emissivity ϵ of the pellicle membrane.

Here, it is difficult to experimentally determine the emissivity ϵ of the pellicle membrane. However, according to Kirchhoff's law, the higher the infrared absorptivity of a film, the higher the emissivity ϵ becomes. Accordingly, the radiation property of the pellicle membrane can be predicted to some degree from the far-infrared absorption spectrum of the pellicle membrane.

The far-infrared absorption of the monocrystalline silicon, namely a conventional pellicle membrane, is only an absorption caused by the stretching vibration mode of Si—Si bonds, and thus the infrared absorptivity is lower. Accordingly, the monocrystalline silicon film has low emissivity.

In contrast, the amorphous carbon, graphite, and amorphous silicon carbide exhibit strong absorption derived from the sp2 carbon bonds, and have high infrared absorptivity. In addition, the DLC and the DLC doped with the third component exhibit absorption derived from the C—H bonds, and strong absorption derived from sp2 carbon bonds, thereby having high infrared absorptivity. Accordingly, all of the DLC film, amorphous carbon film, graphite film and amorphous silicon carbide film have high radiation property.

(ii) The thermal conductive property of the pellicle membrane is determined by the thermal conductivity of a material constituting the film. The thermal conductivity of the monocrystalline silicon is 150 to 170 W/mK. In contrast, the thermal conductivity of the graphite film is 1,000 to 5,000 W/mK; the thermal conductivity of the DLC film is 0.2 to 30 W/mK; and the thermal conductivity of the crystalline silicon carbide film is 100 to 350 W/mK. That is, the silicon film, DLC film and silicon carbide film have low thermal conductive property, whereas the graphite film has high thermal conductive property.

It is apparent from the above descriptions that the monocrystalline silicon film, namely a conventional pellicle membrane, is inferior both in (i) emissivity and (ii) thermal conductive property, and thus has insufficient heat dissipation property. In contrast, the above-mentioned DLC film, amorphous carbon film, graphite film and silicon carbide film are superior in one of or both of (i) emissivity and (ii) thermal conductive property. Accordingly, it can be said that they have high heat dissipation property. In particular, the graphite film is superior in both of (i) emissivity and (ii) thermal conductive property, and has extremely high heat dissipation property.

On the other hand, the heat resistance of the pellicle membrane is determined by the melting point of a material constituting the pellicle membrane. The melting point of the graphite is 3,600° C., while the melting point of the crystalline silicon carbide is 2,600° C. In addition, the DLC and the DLC doped with the third component also have extremely high heat resistance. In contrast, the melting point of the monocrystalline silicon is 1,410° C.

That is, the above-mentioned DLC film, amorphous carbon film, graphite film and silicon carbide film have far superior heat resistance compared to the conventional monocrystalline silicon film.

1-1-7-2. EUV Transmittance and Thickness of Pellicle Membrane

The above-mentioned pellicle membrane preferably has high light transmittance for light to be used for lithography. When using the pellicle for EUV lithography, the pellicle preferably has high EUV transmittance; the transmittance of light to be used for EUV lithography (e.g., light having a wavelength of 13.5 nm or a light having a wavelength of 6.75 nm) is preferably 50% or more, more preferably 80% or more, and even more preferably 90% or more. When the pellicle membrane is supported by a supporting material, or when the pellicle membrane is laminated with an antioxidant layer to be described below, the light transmittance of the film containing the above is preferably 50% or more.

The light transmittance Tr of the pellicle membrane is measured by a photodiode. Specifically, the transmittance Tr is determined from the current value detected without the use of the pellicle membrane (incident light intensity $I_s$), and from the current value detected by using the pellicle membrane (transmitted light intensity I) in accordance with following equation (2):

$$Tr = I/I_0 \qquad (2).$$

The thickness of the pellicle membrane is preferably determined by taking into account the light transmittance of the pellicle membrane, the infrared absorptivity of the pellicle membrane, and the strength and the self-supportiveness of the pellicle membrane. The preferred thickness of the pellicle membrane is about 10 to 120 nm, and when using a supporting material, the thickness of the pellicle membrane is about 9 to 110 nm.

Neither the thickness uniformity nor the surface roughness of the pellicle membrane is particularly questioned. For example, the pellicle membrane may have ununiform film thickness and rough surface as long as disadvantages, such as ununiformity of transmittance and EUV scattering, are not caused by the ununiform film thickness an rough surface of the membrane during the patterning process by EUV exposure. The presence or absence of a wrinkle in the pellicle membrane is not particularly questioned, either. The pellicle membrane may have wrinkles as long as disadvantages, such as ununiformity of transmittance and EUV scattering, are not caused by the ununiform film thickness and rough surface of the membrane during the patterning process by EUV exposure.

The relationship expressed by the following formula (3) exists between the EUV transmittance Tr of the pellicle membrane and the thickness d of the pellicle membrane.

$$Tr=I/I_0=\exp(-\mu\rho d) \quad (3)$$

I: intensity of light transmitted through a pellicle membrane, $I_0$: incident light intensity, d: thickness of pellicle membrane, $\rho$: density, $\mu$: mass absorption coefficient of pellicle membrane The density $\rho$ in formula (3) is intrinsic density of a substance constituting the pellicle membrane. In addition, the mass absorption coefficient $\mu$ in the above formula (3) is determined as set forth below. When the energy of a photon is larger than roughly 30 eV and when the energy of a photon is sufficiently far from the absorption edge of an atom, the mass absorption coefficient $\mu$ does not depend on the bonding state of atoms, or the like. For example, photon energy for a wavelength of 13.5 nm is around 92.5 eV, and is also sufficiently far from the absorption edge of an atom. Therefore, the above-mentioned mass absorption coefficient $\mu$ does not depend on the bonding state of atoms of the compounds constituting the pellicle membrane. Accordingly, the mass absorption coefficient $\mu$ of the pellicle membrane is determined from mass absorption coefficient $\mu_1$ of each element (1, 2, . . . , i) constituting the pellicle membrane, and from mass fraction $W_i$ of each element, in accordance with the following equation (4):

$$\mu=\mu_1 W_1+\mu_2 W_2+\ldots \mu_i W_i \quad (4)$$

The above $W_i$ is a value determined by $W_i=n_i A_i/\Sigma n_i A_i$. $A_i$ represents the atomic weight of each element i, and $n_i$ represents the number of each element i.

With respect to the mass absorption coefficient $\mu_i$ of each element in the above equation (4), use can be made of the values set forth in the following reference edited by Henke et al. (B. L. Henke, E. M. Gullikson, and J. C. Davis, "X-ray Interactions: Photoabsorption, Scattering, Transmission, and Reflection at E=50-30,000 eV, Z=1-92" At. Data Nucl. Data Tables 54, 181 (1993); Latest edition of these numerical values is listed at http://wwwcxro.lbl.gov/optical_constants/.).

That is, when the mass absorption coefficient $\mu$ of the pellicle membrane and the film density $\rho$ are specified, preferred thickness d of the pellicle membrane can be set based on a desired EUV transmittance Tr.

1-1-7-3. Stress of Pellicle Membrane

A stress may sometimes remain in the pellicle membrane obtained by forming a thin film on the substrate such as the silicon wafer. When the residual stress of the pellicle membrane is larger, a crack may occur, or the residual stress may be a cause of tearing when the membrane is used as a self-supporting membrane, and thus the pellicle membrane preferably has small residual stress. The direction and the size of the residual stress of the pellicle membrane can be determined by measuring the direction and the size of a warpage of the substrate on which the membrane is formed. The direction and the size of the warpage of the substrate on which the film is formed can be measured, for example, with a displacement measuring apparatus utilizing laser light, specifically with a three-dimensional measuring instrument (NH-3SP, Mitaka Kohki Co., Ltd.). The size of the residual stress of the pellicle membrane is desirably 1 GPa or less, more desirably 0.5 GPa or less, and more desirably 0.2 GPa or less.

The residual stress is desirably a stress in the tensile direction. When the direction of the residual stress is in the tensile direction, application of tension to the membrane results in an obtainment of an unwrinkled self-supporting membrane. On the other hand, when the direction of the residual stress is in the compressive direction, wrinkles are caused by the compressive force applied to the membrane. When the membrane has a wrinkle, the thickness of the membrane at the time of transmittance of EUV light varies depending on the angle of the wrinkle, and thus ununiformity is likely to occur in the EUV transmittance of the membrane. In addition, presence of a wrinkle is undesirable in view of tearing which is likely to occur due to external force such as vibration.

1-1-7-4. Evaluation of EUV Resistance of Pellicle Membrane

EUV resistance of a pellicle membrane can be evaluated by irradiating the pellicle membrane with EUV, and conducting various analyses to the irradiated part and unirradiated part of the membrane. For example, methods for composition analyses, such as XPS measurement, EDS analysis and RBS; methods for structural analyses, such as XPS, EELS, IR measurement and Raman spectroscopy; film thickness evaluation methods, such as ellipsometry, interference spectroscopy and X-ray reflection method, and methods for evaluating appearance or surface shape, such as microscope observation, SEM observation and AFM observation, can be used. The heat dissipation property may be studied in more detail by further combining the analytic results from computer simulation.

The resistance of the pellicle membrane against factors other than EUV light can be evaluated by appropriately selecting methods, such as vacuum ultraviolet irradiation, ultraviolet-visible light irradiation, infrared irradiation, electron ray irradiation, plasma irradiation and heating treatment, depending on the factor to be evaluated.

<Evaluation of Film Strength of Pellicle Membrane>

An example of the method of evaluating the strength of the pellicle membrane on the substrate includes an evaluation method using a nano indenter. As the method of evaluating the film strength of the self-supporting membrane, it is possible to use methods such as a resonance method, bulge test method, a method of evaluating presence/absence of tearing caused by air blow, and a method of evaluating presence/absence of tearing caused by a vibration test.

1-2. Antioxidant Layer

An antioxidant layer may be laminated on the surface of the above-mentioned pellicle membrane. When the antioxidant layer is laminated on the surface of the pellicle membrane, the oxidation of the pellicle membrane is suppressed during EUV irradiation or during storage of the pellicle. The antioxidant layer may be either formed only on one surface of the pellicle membrane, or formed on both surfaces thereof.

The type of the antioxidant layer is not particularly limited as long as the layer is a film composed of a material stable to the BUV. For example, the antioxidant layer may be a film or the like composed of SiOx (x≤2), SixNy (x/y is 0.7 to 1.5), SiON, $Y_2O_3$, YN, Mo, Ru, Rb, Sr, Y, Zr, Nb, or Rh.

For preventing the inhibition of the transmittance of EUV, the thickness of the antioxidant layer is desirably about 1 to 10 nm, and more desirably about 2 to 5 nm. Thick antioxidant layer is undesirable because the transmittance may sometimes be lowered due to absorption of EUV light by the antioxidant layer. The thickness of the pellicle membrane is desirably within the range of from 10 to 120 nm, and more preferably 10 to 30 nm. The ratio of the thickness of the antioxidant layer to the thickness of the pellicle membrane is desirably within the range of from 0.03 to 1.0. The ratio of the thickness of the antioxidant layer to the thickness of the pellicle membrane being large is undesirable because EUV transmittance may be lowered sometimes.

In addition, when the antioxidant layer is laminated, the reflection of the EUV light occurs at newly formed layer interfaces, i.e., an interface between the antioxidant layer and air and an interface between the antioxidant layer and the pellicle membrane. Therefore, the lowering of the transmittance occurs. The reflectance of the EUV light at these layer interfaces can be determined by calculation, depending on the thickness of the pellicle membrane and the antioxidant layer and on the type of elements constituting the pellicle membrane and the antioxidant layer. Optimization of the film thickness can lower the reflectance in the same manner as in the principle of the antireflective film.

It is desirable that the thickness of the antioxidant film is optimized within a range which suppresses the lowering of transmittance of EUV light due to absorption as well as the lowering of transmittance of the EUV light due to reflection, and exhibits an antioxidation capacity.

Neither thickness uniformity nor surface roughness of the antioxidant layer is particularly limited. As long as no disadvantages, such as ununiformity of transmittance and scattering of the EUV light, are caused by the ununiformity of film thickness and surface roughness during the patterning process by EUV exposure, the antioxidant film may be composed of either a continuous layer or insular layers. In addition, the antioxidant film may have either ununiform thickness or surface roughness.

The average refractive index of the pellicle membrane combined with the antioxidant layer is desirably within the range of from 1.9 to 5.0. The refractive index can be measured by a method, such as spectroscopic ellipsometry. In addition, the average density of the pellicle membrane combined with the antioxidant layer is desirably within the range of from 1.5 to 5.0 g/cm$^3$. The density can be measured by, for example, X-ray reflection method.

1-3. Pellicle Frame

The pellicle frame is not particularly limited as long as the pellicle frame is a frame capable of stretching the above-mentioned pellicle membrane via a film adhesive layer, or the like. Examples of the pellicle frame include frames made of aluminum, stainless steel, polyethylene, and ceramic. As illustrated in FIG. 1, for example, the pellicle frame 14 may have vent hole 16 for maintaining the pressure within a region surrounded by pellicle 10 and an original plate (not illustrated), and the inside of the EUV exposure device at a constant level. Since EUV exposure is conducted in a vacuum environment, ununiform pressure in these regions may have a risk of stretching or damaging pellicle membrane 12 by pressure difference. Vent hole 16 is preferably provided with a filter so as not to allow foreign mattes to enter the region surrounded by the pellicle and the original plate. The filter may be an Ultra Low Penetration Air (ULPA) filter or a metal mesh. In addition, for facilitating an examination of the frame, the pellicle frame may be colored in such a degree that does not cause disadvantages on exposure.

The procedure or the method of fixing the pellicle membrane to the pellicle frame is not particularly limited. In addition, an etched substrate may be used as a part of the pellicle frame. For example, the pellicle membrane is laminated on a substrate that can be removed by a specific treatment method, such as metal, silicon wafer, glass, resin, or salt. Thereafter, a mask adjusted to the size of the frame, is applied on a surface of the substrate opposite to the surface on which the pellicle membrane is disposed, and the substrate is etched or dissolved while leaving the mask shape. By such a method, it is possible to obtain a pellicle with a part of the substrate being used as a pellicle frame.

The trimming method for aligning the shape of the substrate with the frame shape is not particularly limited. When using a silicon wafer as the substrate, it is possible to use a method in which a wafer is mechanically split, or a laser trimming method.

1-4 Film Adhesive Layer

The method of stretching pellicle membrane 12 on pellicle frame 14 is not particularly limited. Pellicle membrane 12 may be adhered directly to pellicle frame 14, or via film adhesive layer 13 provided on one end surface of pellicle frame 14; alternatively pellicle membrane 12 may be fixed to pellicle frame 14 utilizing a mechanically fixing method or attraction by a magnet, or the like.

Film adhesive layer 13 is a layer for adhering the pellicle frame and the pellicle membrane together. Film adhesive layer 13 may be a layer composed of, for example, an acrylic resin adhesive, an epoxy resin adhesive, a polyimide resin adhesive, or a silicone resin adhesive. From the viewpoint of keeping vacuum during EUV exposure, the film adhesive layer preferably has less outgas. As the method of evaluating the outgas, for example a temperature-programmed desorption gas analyzer can be used.

When the pellicle membrane and the pellicle frame have adhesiveness, it is not necessary to use film adhesive layer 13. As the method of evaluating the adhesiveness of the pellicle membrane and the pellicle frame, it is possible to use, for example, a method in which the presence/absence of tearing or peeling-off of the film after an air blow is evaluated while changing pressure, area, distance and angle of the air blow, or a method in which a vibration test is performed while changing acceleration and amplitude to evaluate the presence/absence of tearing or peeling-off of the film.

1-5. Adhesive Layer for Original Plate

Adhesive layer 15 for the original plate allows pellicle frame 14 and the original plate to adhere to each other. As illustrated in FIG. 1, adhesive layer 15 for the original plate is provided on an end portion of pellicle frame 14 where the pellicle membrane 12 is not stretched. Adhesive layer 15 for the original plate may be, for example, a double-sided adhesive tape, a silicone resin adhesive, an acrylic adhesive, a polyolefin adhesive, or the like. For example, from the viewpoint of keeping vacuum during EUV exposure, the adhesive layer for the original plate preferably has less outgas. As the method of evaluating the outgas, for example a temperature-programmed desorption gas analyzer can be used.

When the pellicle is used for the EUV exposure, film adhesive layer 13 and adhesive layer 15 for the original plate are exposed to the EUV light scattered in the EUV exposure device, and thus, the adhesive layer desirably has an EUV resistance. When the EUV resistance is low, the adhesiveness or the strength of the adhesive is lowered during the EUV exposure, causing defects, such as peeling-off of the adhesive, generation of foreign matter, and the like inside the exposure device. For the resistance evaluation by EUV irradiation, methods of composition analyses, such as XPS measurement, EDS analysis and RBS; methods of structural analyses, such as XPS, EELS, IR measurement and Raman spectroscopy; film thickness evaluation methods, such as ellipsometry, interference spectroscopy and X-ray reflection method; appearance or surface shape evaluation methods, such as microscope observation, SEM observation and AFM observation; methods of evaluating strength and adhesiveness using a nano indenter or a peeling test can be used.

The method of stretching the original plate on pellicle frame 14 is not particularly limited. The original plate may be adhered directly to pellicle frame 14, or via adhesive layer 15 for the original plate on one end surface of pellicle frame 14; alternatively the original plate may be fixed to pellicle frame 14 utilizing a mechanically fixing method or attraction by a magnet, or the like.

1-6. Application of Pellicle

The pellicle of the present invention is can be used as a protective member for suppressing the adhesion of foreign matters to the original plate inside various exposure devices. In particular, the pellicle is advantageous as a member for suppressing the adhesion of foreign matters to the original plate inside the EUV exposure device. In addition, the pellicle may be used not only as the protective member for suppressing the adhesion of foreign matters to the original plate inside various exposure devices, but also as a protective member for protecting the original plate during storage or conveyance thereof. For example, when the pellicle is kept attached to the original plate (exposure original plate), then it becomes possible to detach the pellicle-attached original plate from the exposure device and store it as it is. Examples of the methods of attaching the pellicle to the original plate include an adhering method with an adhesive, an electrostatic adsorption method, and a mechanically fixing method.

In lithography, it is necessary to precisely transfer a circuit pattern. Accordingly, the transmittance of exposure light needs to be approximately uniform within the range of exposure. Use of the pellicle membrane of the present invention allows an obtainment of a pellicle having constant light transmittance within the range of exposure.

2. EUV Exposure Device

Figure 5:
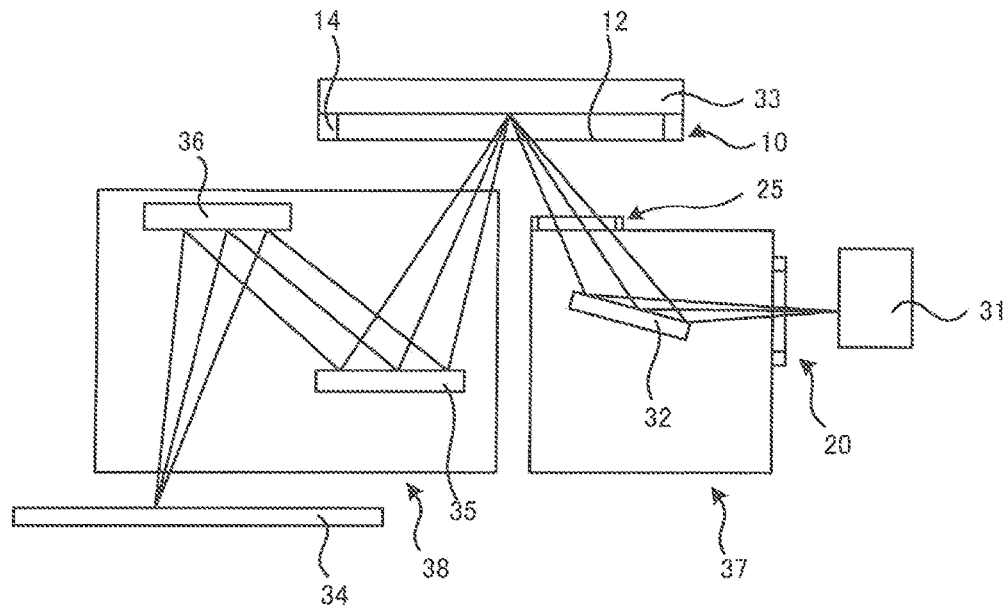
FIG. 5 is a schematic sectional view illustrating an example of an EUV exposure device of the present invention.

An example of using the pellicle of the present invention in the EUV exposure device is described. FIG. 5 is a schematic sectional view of the EUV exposure device. The EUV exposure device includes EUV light source 31 to emit EUV, illumination optical system 37 to guide light from EUV light source 31 to original plate 33, original plate 33 to reflect EUV in a pattern, and projection optical system 38 to guide light reflected at original plate 33 to sensitive substrate 34. The above-mentioned pellicle 10 is adhered to the side of EUV irradiation surface of original plate 33. In addition, the above-mentioned filter windows 20 and 25 are respectively provided between EUV light source 31 and illumination optical system 37, and between illumination optical system 37 and original plate 33. In the EUV exposure device, the light reflected by original plate 33 is guided onto sensitive substrate 34 through projection optical system 38, so that sensitive substrate 34 is exposed in a pattern. It is noted that the exposure by EUV is conducted under reduced pressure conditions.

EUV light source 31 emits EUV toward illumination optical system 37. EUV light source 31 includes a target material, a pulse laser irradiation part, and the like. A pulse laser is irradiated on the target material to generate plasma, to thereby obtain EUV. When Xe is employed as the target material, EUV having a wavelength of 13 to 14 nm is obtained. The wavelength of the light emitted by the EUV light source is not limited to 13 to 14 nm, and may be any suitable wavelength selected from the range of from 5 to 30 nm.

Illumination optical system 37 condenses light irradiated from EUV light source 31, equalize illuminance, and irradiate the light on original plate 33. Illumination optical system 37 includes a plurality of multilayer film mirrors 32 for adjusting the optical path of the EUV, an optical coupler (optical integrator), and the like. The multilayer film mirror is, for example, a multilayer film in which molybdenum (Mo) and silicon (Si) are laminated alternately.

The method of attaching filter windows 20 and 25 is not particularly limited; examples thereof include an adhering method via an adhesive, or the like, and a method in which the filter windows are fixed mechanically inside the EUV exposure device. Filter window 20 disposed between EUV light source 31 and illumination optical system 37 traps scattering particles (debris) generated from the light source to suppress the attachment of the scattering particles (debris) to an element (e.g., multilayer film mirror 32) inside illumination optical system 37. On the other hand, filter window 25 disposed between illumination optical system 37 and original plate 33 traps particles (debris) scattered from EUV light source 31 side to suppress the attachment of the scattering particles (debris) to original plate 33.

Original plate 33 can be a structure containing a supporting substrate, a reflective layer laminated on the supporting substrate, and an absorbent layer formed on the reflective layer. The absorbent layer partially absorbs the EUV, to thereby form a desired image on sensitive substrate 34. The reflective layer may be a multilayer film composed of molybdenum (Mo) and silicon (Si). The absorbent layer may be a material having high EUV absorbability, such as chrome (Cr) or tantalum nitride.

In addition, pellicle 10 is attached to original plate 33 via an adhesive layer for the original plate, or the like. Foreign matters that attach to the original plate absorb or scatter the EUV, and thus cause defective resolution on a wafer. Accordingly, pellicle 10 is attached to the original plate so as to cover an EUV irradiation area thereof. The EUV passes through pellicle membrane 12 and is irradiated on original plate 33.

The method of attaching pellicle 10 to original plate 33 is not particularly limited as long as the method is capable of providing pellicle 10 on the original plate in a manner such that foreign matters are prevented from attaching to the surface of the original plate. Examples of such methods include a method in which pellicle frame 14 is adhered to original plate 33 with an adhesive, an electrostatic adsorption method, and a mechanically fixing method, although the method is not particularly limited. Preferably, the adhering method with an adhesive is used.

The EUV reflected by original plate 33 passes thorough pellicle membrane 12 and is irradiated on sensitive substrate 34 through projection optical system 38. Projection optical system 38 condenses the light reflected by original plate 33 and irradiates sensitive substrate 34. Projection optical system 38 includes, for example, a plurality of multilayer film mirrors 35 and 36 for adjusting the optical path of the EUV.

Sensitive substrate 34 is, for example, a substrate on which a resist is applied on a semiconductor wafer, and the resist is cured in a pattern by the EUV reflected by original plate 33. The resist is developed, and the semiconductor wafer is etched, thereby forming a desired pattern on the semiconductor wafer.

EXAMPLES

Example 1

(1) Production of Pellicle Membrane

A pellicle membrane (DLC (a-C:H) film) having a thickness of 90 nm was formed on a circular silicon wafer having a diameter of 4 inches by plasma-based ion implantation and deposition (PBIID method). The resultant laminate (sample) composed of the pellicle membrane and the silicon wafer was prepared in duplicate. With respect to the prepared pellicle membrane, determination of the composition, and measurement of refractive index and Raman spectrum were performed in accordance with the following method.

(1-1) Determination of Composition

The amount of each element contained in the prepared pellicle membrane was specified by Rutherford Backscattering Spectrometry method (RBS)/Hydrogen Forward Scattering Spectroscopy (HFS), and XPS measurement method. For RBS/HFS measurements, an accelerator (Pelletron 3 SDH manufactured by National Electrostatics Corporation) was used. The measurement conditions were set as follows: incident ion: 4He++, incident energy: 2,300 keV, incident angle: 75°, scattering angle: 160°, recoil angle: 30°, and beam diameter: 2 mm. On the other hand, for the XPS measurement, an X-ray photoelectron spectrometer (AXIS-ULTRA series manufactured by Kratos Analytical Ltd.) was used. AlKα was employed as an X-ray source, and the analytical area was set to 120×120 µm. The calculated composition ratio is shown in Table 1.

(1-2) Measurement of Refractive Index

With respect to the prepared pellicle membrane, ψ spectrum (amplitude ratio between s-polarized light and p-polarized light) and Δ spectrum (retardation between s-polarized light and p-polarized light) were detected by spectroscopic ellipsometry (Auto-SE manufactured by Horiba, Ltd.). The measurement conditions were set as follows: measurement wavelength: 400 to 1,000 nm, incident angle: 70°, and condensed beam diameter: 100 mm. The above-mentioned spectra were analyzed based on dispersion formula (literature value) of the supporting material (silicon wafer (Si) in this measurement) and on dielectric function model (Tauc-Lorentz formula) of the film. The analysis was conducted using a two-layer model composed of substrate/thin film/surface roughness layer. Then, refraction index n and extinction coefficient k of the pellicle membrane for each wavelength were calculated. The calculated refractive index n for light having a wavelength of 550 nm is shown in Table 1.

(1-3) Raman Spectrum Measurement

Raman spectrum of the prepared pellicle membrane was measured using a Raman microscope (XploRA manufactured by Horiba, Ltd.). The measurement conditions were set as follows: environmental atmosphere: in the atmospheric air, excitation light: 532 nm, grating: 600T, and measurement area: 400 to 3,200 cm$^{-1}$. As for the measured Raman spectrum, a broad peak that appears at about 900 to 1,800 cm$^{-1}$ was split into two bands of G-band around 1,590 cm$^{-1}$ and D-band around 1,350 cm$^{-1}$ by Gaussian function to calculate the intensity of the G-band (I(G)). On the other hand, the intensity of 2D-band (I(2D)) that appears at about 2,800 to 2,600 cm$^{-1}$ was specified to determine the ratio between the intensity of the G-band (I(G)) and the intensity of the 2D-band (I(2D))(I(2D)/I(G)). The calculated intensity ratio (2D/G) is shown in Table 1.

(2) Processing of Silicon Wafer (Supporting Material)

Of the above-prepared two samples, the silicon wafer (supporting material) of one sample was subjected to processing. Specifically, the silicon wafer was polished to obtain a silicon wafer having a thickness of 200 µm. Further, the silicon wafer was dry-etched into a mesh shape from the silicon wafer side. The width of the line constituting the mesh was 10 µm, and the interval between lines was 200 µm. In addition, the peripheral portion (width: 10 mm) of the silicon wafer was not etched. When the pellicle membrane on the resultant silicon mesh was observed using a reflection optical microscope and a transmission optical microscope, no tearing was found in a part of the pellicle membrane which is not in contact with the silicon mesh.

(3) EUV Irradiation

The pellicle membranes of a sample with an unprocessed supporting material (sample 1-A) and a sample with a mesh-processed supporting material (sample 1-B) were individually subjected to EUV irradiation under the following conditions. Light (EUV) having a wavelength of 13.5 nm was irradiated from the pellicle membrane side using an EUV irradiation device (BL-10 at New Subaru (facility name), University of Hyogo). The illuminance was 150 mW/cm$^2$, the irradiation time was 30 minutes, and the irradiation direction of the EUV was vertical to the membrane plane. The beam size determined by the full width at half maximum of the incident light intensity was 0.15 mm×0.8 mm.

Figure 6:
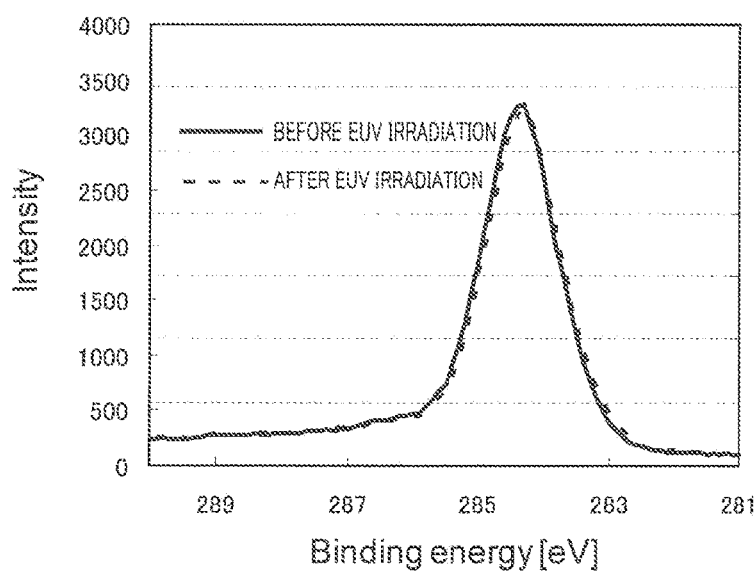
FIG. 6 is a graph illustrating XPS spectra of a pellicle membrane of Example 1 before and after EUV irradiation.

The color change of an EUV-irradiated part, the change in Raman spectrum after the EUV irradiation, and the change in XPS-measured values of sample 1-A after the EUV irradiation were determined in accordance with the following methods. The results are shown in Table 1. In addition, the spectra measured by XPS (before and after the EUV irradiation) are shown in FIG. 6.

On the other hand, with respect to sample 1-B after the EUV irradiation, the color change of an EUV-irradiated part, measurement of EUV transmittance, and evaluation of the stability of EUV transmittance were determined in accordance with the following methods. The results are shown in Table 1.

(3-1) Observation of Appearance (Evaluation of Color change)

Under a reflection optical microscope, the sample 1-A and the sample 1-B were observed to check the color change of the pellicle membrane before and after the EUV irradiation. The evaluation was conducted as follows:

No color change in all of the EUV-irradiated region: A
Color change in an EUV-irradiated region: B (3-2) Change in Raman Spectrum As for an EUV-irradiated region of the sample 1-A, the Raman spectrum was measured to determine the ratio between the intensity of the 2D-band (I(2D)) and the intensity of G-band (I(G))(I(2D)/I(G)). The methods for measuring Raman spectrum and for calculating the intensity ratio were the same manner as those described above. Then, the stability of the DLC film to the EUV before and after the EUV irradiation was evaluated in accordance with the following standards. A large change indicates the change in the composition of the film or the bonding state of carbon atoms constituting the film.

The change in the intensity ratio between the G-band and the 2D-band before and after the EUV irradiation was within 5%: A The change in the intensity ratio between the G-band and the 2D-band before and after the EUV irradiation was more than 5%: B (3-3) Change in XPS Value In the film containing carbons, a peak derived from sp2 bonds (284 eV) and a peak derived from sp3 bonds (285 eV) are observed in the C1s peak of the XPS spectrum.

Thus, for sample 1-A, the C1s peak (the ratio between the peak intensity of 284 eV and the peak intensity of 285 eV) of the DLC film before the EUV irradiation was compared with the C1s peak of the DLC film after the EUV irradiation to determine whether or not the bonding state of carbon atoms constituting the film was changed. XPS spectrum was obtained using an X-ray photoelectron spectrometer (AXIS-ULTRA series manufactured by Kratos Analytical Ltd., analytical area: 120 μm). Then, the stability of the pellicle membrane to the EUV was evaluated according to the following standards:

The change in C1s spectrum before and after the EUV irradiation was within 5%: A The change in C1s spectrum between before and after the EUV irradiation was more than 5%: B (3-4) Measurement of EUV Transmittance EUV transmitted through the pellicle membrane of the sample 1-B was detected with a photodiode to determine the EUV transmittance from a current value at the time of the detection. Specifically, EUV transmittance Tr was determined from a current value detected without the sample (incident light intensity $I_0$) and a current value detected with the sample (transmitted light intensity I) in accordance with equation (2) below. The current value with the sample was detected immediately after the start of the EUV irradiation.

$$Tr = I/I_0 \quad (2)$$

(3-5) Evaluation of Stability of EUV Transmittance

As for the sample 1-B, the EUV transmittance during the EUV irradiation was calculated according to the above-described method. Then, the EUV transmittance was defined as standardized transmittance (a value determined by the following equation (5)) which is a quotient of the transmittance Tr(t) at EUV irradiation time (t) divided by transmittance immediately after the start of the irradiation Tr(0), and the fluctuation of this standardized transmittance was measured.

$$\text{Standardized transmittance} = Tr(t)/Tr(0) \quad (5)$$

The EUV transmittance stability of the film was evaluated in accordance with the following standards.

The fluctuation of standardized transmittance was less than 3% over 30 minutes: A The fluctuation of standardized transmittance was 3% or more over 30 minutes: B Example 2

(1) Production of Pellicle Membrane

A pellicle membrane (DLC (ta-C) film) having a thickness of 100 nm was formed on a silicon wafer having a diameter of 4 inches by Filtered Cathodic Vacuum Arc method (FCVA method). With the respect to the resultant pellicle membrane, determination of its composition, and measurement of refractive index and Raman spectrum were performed in the same manner as in Example 1. The results are shown in Table 1.

(2) EUV Irradiation

Figure 7:
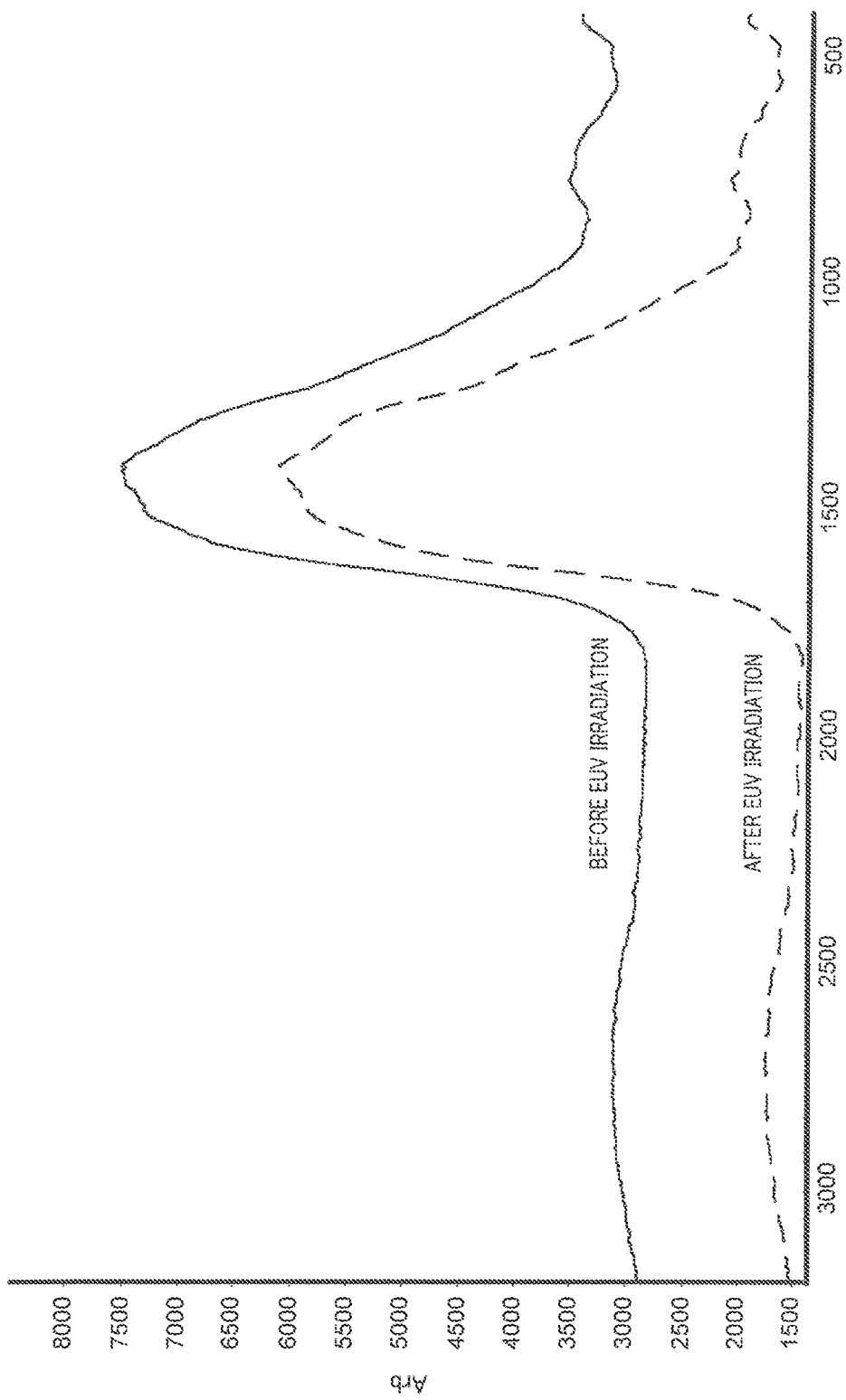
FIG. 7 is a graph illustrating Raman spectra of a pellicle membrane of Example 2 before and after EUV irradiation.

A sample with an unprocessed supporting material (sample 2) was subjected to EUV irradiation under the conditions described in Example 1. The color change of an EUV-irradiated part, the change in Raman spectrum after the EUV irradiation, and the change in XPS-measured values of sample 2 were confirmed. The results are shown in Table 1. In addition, Raman spectra of sample 2 before and after the EUV irradiation are shown in FIG. 7.

Example 3

(1) Production of Pellicle Membrane

An amorphous carbon film having a thickness of 120 nm was formed on a slide glass having a width of 5 cm and a length of 5 cm by a vacuum deposition method. The resultant slide glass was immersed in water to peel off the amorphous carbon film from the slide glass. Then, the amorphous carbon film was skimmed off with a circular frame (diameter: 10 mm) made of a resin. No tearing was found in the amorphous carbon film. With the respect to the resultant amorphous carbon film, determination of its composition, and measurement of refractive index and Raman spectrum were performed in the same manner as in Example 1. The results are shown in Table 1.

(2) EUV Irradiation

Figure 8:
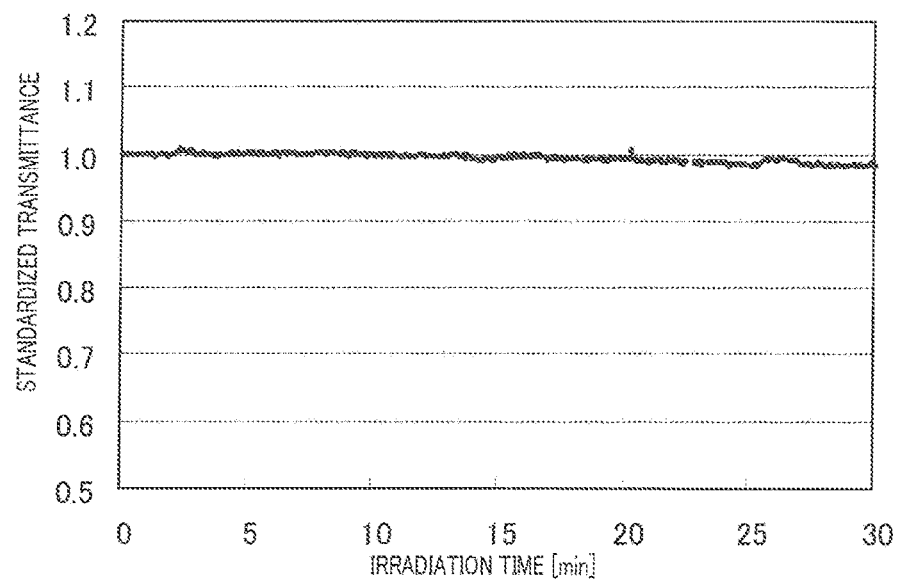
FIG. 8 is a graph illustrating the stability of EUV transmittance of a pellicle membrane of Example 3.

A pellicle membrane supported by a frame made of a resin (sample 3) was subjected to EUV irradiation under the conditions described in Example 1. The color change of an EUV-irradiated part, EUV transmittance, the stability of EUV transmittance, the change in Raman spectrum after the EUV irradiation, and the change in XPS-measured values of sample 3 were confirmed. The results are shown in Table 1. In addition, a graph illustrating the fluctuation of EUV standardized transmittance is shown in FIG. 8.

Example 4

(1) Production of Pellicle Membrane

A pellicle membrane (amorphous silicon carbide film) having a thickness of 100 nm was formed on a silicon wafer having a diameter of 4 inches by an ion plating method. Such a laminate composed of the pellicle membrane and the silicon wafer was prepared in duplicate. With the respect to the resultant pellicle membrane, determination of its composition, and measurement of refractive index and Raman spectrum were performed in the same manner as in Example 1. The results are shown in Table 1.

(2) Processing of Silicon Wafer (Supporting Material)

Of the above-prepared two samples, the silicon wafer (supporting material) of one sample was processed into a mesh shape. The method of processing the silicon wafer was the same as that used in Example 1. When the pellicle membrane on the resultant silicon mesh was observed using a reflection optical microscope and a transmission optical microscope, no tearing was found in a part of the pellicle membrane which is not in contact with the silicon mesh.

(3) EUV irradiation

Figure 9:
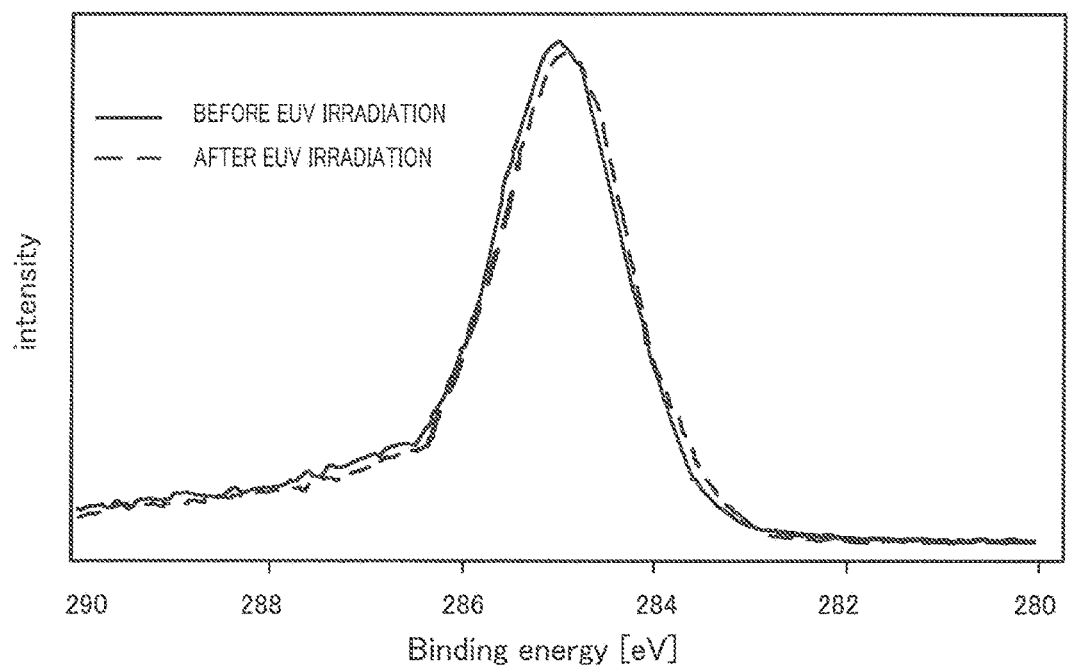
FIG. 9 is a graph illustrating XPS spectra of a pellicle membrane of Example 4 before and after EUV irradiation.

The pellicle membranes of a sample with an unprocessed supporting material (sample 4-A) and a sample with a mesh-processed supporting material (sample 4-B) were individually subjected to EUV irradiation under the conditions used in Example 1. The color change of an EUV-irradiated part, the change in Raman spectrum after the EUV irradiation, and the change in XPS-measured values of sample 4-A after the EUV irradiation were determined. The results are shown in Table 1. On the other hand, with respect to sample 4-B, the color change of an EUV-irradiated part was determined. The results are shown in Table 1. In addition, spectra (before and after the EUV irradiation) measured by XPS are shown in FIG. 9.

Example 5

(1) Production of Pellicle Membrane

Highly oriented pyrolytic graphite (HOPG) film (grade: ZYA, Double Side, thickness 2 mm) manufactured by MIK-ROMASCH, Inc. was provided. The mosaic spread of the graphite film was 0.4±0.1, and the density was 2.27 g/cm³. An adhesive tape cut out into a frame shape (external dimension: 12 mm×12 mm, frame width: 1 mm) was adhered to the graphite film (12 mm×12 mm×2 mm). Then, the adhesive tape was mechanically peeled off from the graphite film to cleave the graphite film, to thereby afford a graphite film having a thickness of 0.24 mm. No tearing was found in the graphite film. The resultant graphite film was adhered to a pellicle frame (external dimension: 12 mm×12 mm, frame width: 1 mm) made of aluminum alloy A 7075 to afford a pellicle.

With the respect to the resultant pellicle, determination of its composition, and measurement of refractive index and Raman spectrum were performed in the same manner as in Example 1.

(2) EUV Irradiation

The above pellicle membrane was subjected to EUV irradiation under the conditions described in Example 1. Then, the color change of an EUV-irradiated part, EUV transmittance, the stability of EUV transmittance, the change in Raman spectrum after the EUV irradiation, and the change in XPS-measured values of the pellicle membrane were confirmed. The results are shown in Table 1.

Example 6

(1) Production of Pellicle Membrane

A polycrystalline silicon carbide film having a thickness of 300 nm was formed on a silicon wafer having a diameter of 4 inches by LPCVD method using a mixed gas of $SiH_2Cl_2$ and $C_2H_2$. A laminate composed of the polycrystalline silicon carbide film and the silicon wafer was prepared in duplicate. The resultant polycrystalline silicon carbide film was polished by CMP method to obtain a pellicle membrane having a thickness of 150 nm. With the respect to the resultant pellicle membrane, determination of its composition, and measurement of refractive index and Raman spectrum were performed in the same manner as in Example 1. The results are shown in Table 1.

(2) Processing of Silicon Wafer (Supporting Material)

Of the above-prepared two samples, one sample was subjected to wet-etching at 80° C. using an etching solution of an aqueous KOH solution (concentration 17%) to afford a pellicle membrane with a dimension of 500 μm×1,000 μm. When the resultant pellicle membrane was observed under a reflection optical microscope and a transmission optical microscope, no tearing was found in a part of the pellicle membrane which is not in contact with the silicon mesh.

(3) EUV Irradiation

The above-obtained pellicle membrane was subjected to EUV irradiation under the conditions described in Example 1. In addition, the color change of an EUV-irradiated part, the EUV transmittance, and the stability of EUV transmittance were determined in accordance with the methods described in Example 1.

Comparative Example 1

A copper foil was provided, and a graphene film was produced on the copper foil by CVD method using a mixed gas of $CH_4$, $H_2$, and Ar. A PET (polyethylene terephthalate) film was laminated on the produced graphene film. The resultant laminate was immersed in dilute hydrochloric acid to dissolve and remove the copper foil. Subsequently, the resultant laminate of the PET film and graphene was immersed in hexafluoroisopropanol to dissolve and remove the PET film. The graphene film was torn during the dissolution of the PET film, and thus a pellicle membrane was not obtained.

TABLE 1

| | | Composition | | | Film Thickness [nm] | Raman Spectrum (I(2D)/I(G)) | Refractive Index (Wavelength 550 nm) | Evaluation of EUV Irradiation Resistance | | | | |
|---|---|---|---|---|---|---|---|---|---|---|---|---|
| Pellicle Membrane Type | Film-Forming Method | C [% by mole] | H [% by mole] | Si [% by mole] | | | | Color Change at EUV-Irradiated Part | EUV Transmittance (%) | Stability of EUV Transmittance | Change in Raman Spectrum (I(2D)/I(G)) | Change in XPS-Measured Value |
| Ex. 1 DLC (a-C:H) | PBIID | 74 | 26 | 0 | 90 | 0.1 | 2.03 | A*A A*B | — 43*B | — A*B | A*A — | A*A — |
| Ex. 2 DLC (ta-C) | FCVA | 100 | 0 | 0 | 100 | 0.046 | 2.46 | A*A | — | — | A*A | A*A |
| Ex. 3 Amorphous Carbon | Vacuum Deposition | 100 | 0 | 0 | 120 | 0.081 | 1.95 | A*C | 49*C | A*C | A*C | A*C |
| Ex. 4 Amorphous Silicon Carbide | Ion Plating | 83 | 0 | 17 | 100 | 0.091 | 2.4 | A*A A*B | — — | — — | A*A — | A*A — |
| Ex. 5 Graphite | Thermal Decomposition | 100 | 0 | 0 | 240 | 0.35 | 3 (Literature Value) | A*C | 21*C | A*C | A*C | — |
| Ex. 6 Polycrystalline | CVD | 50 | 0 | 50 | 150 | 0.068 | 2.66 | A*C | 47*C | A*C | — | — |

TABLE 1-continued

| | Pellicle Membrane Type | Film-Forming Method | Composition C [% by mole] | Composition H [% by mole] | Composition Si [% by mole] | Film Thickness [nm] | Raman Spectrum (I(2D)/I(G)) | Refractive Index (Wavelength 550 nm) | Evaluation of EUV Irradiation Resistance Color Change at EUV-Irradiated Part | Evaluation of EUV Irradiation Resistance EUV Transmittance (%) | Evaluation of EUV Irradiation Resistance Stability of EUV Transmittance | Evaluation of EUV Irradiation Resistance Change in Raman Spectrum (I(2D)/I(G)) | Evaluation of EUV Irradiation Resistance Change in XPS-Measured Value |
|---|---|---|---|---|---|---|---|---|---|---|---|---|---|
| Com. Ex. 1 | Silicon Carbide Graphene | CVD | 100 | 0 | 0 | 0.34 (Literature Value) | 2 (Literature Value) | 2 (Literature Value) | Impossible to Evaluate | Impossible to Evaluate | Impossible to Evaluate | Impossible to Evaluate | Impossible to Evaluate |

*[A]Confirmed in the pellicle membrane laminated with the tabular supporting material
*[B]Confirmed in the pellicle membrane laminated with the mesh-like supporting material
*[C]Confirmed in the single pellicle membrane As shown in Table 1, in Examples 1 to 6, no color change was found in the pellicle membrane after the EUV irradiation. In addition, the evaluation results of the Raman spectrum measurement and XPS measurement were also favorable, and there was hardly no change in quality of the membrane due to the EUV irradiation. Further, even a 30-minute continuous EUV irradiation hardly changed the EUV transmittance. From these results, it can be concluded that the DLC film, amorphous carbon film, amorphous silicon carbide film, graphite, and polycrystalline silicon carbide were hardly deteriorated by the energy (light and heat) applied during the EUV irradiation.

It is noted that, in the pellicle irradiation device, the temperature of the pellicle membrane becomes elevated due to the EUV irradiation performed for a long period of time. On the other hand, the pellicle membrane is cooled to room temperature after stopping the device. Accordingly, the pellicle membrane needs to withstand such temperature change. The DLC film, amorphous carbon film, amorphous silicon carbide film and graphite film are excellent in heat resistance and heat dissipation property as described above, and by virtue of such properties, these films do not easily deteriorated due to temperature change as well.

Here, with respect to the graphite film of Example 5, a theoretical value of the transmittance Tr of light having a wavelength of 135 nm was calculated based on the following equation (3). The theoretical value of transmittance Tr was 20% and this value approximately coincided with the above-mentioned measurement result.

$$Tr = I/I_0 = \exp(-\mu\rho d) \quad (3)$$

(in equation (3), I represents transmitted light intensity; $I_0$ represents incident light intensity; d represents thickness of the film (in Example 5, 0.24 μm); ρ represents density; and μ represents mass absorption coefficient of the pellicle membrane)

That is, based on the above equation (3), it becomes possible to predict the light transmittance Tr of a pellicle membrane even when its thickness is changed. Thus, based on the above equation (3), the transmittance of a 13.5 nm wavelength light was calculated for each of a 100 nm-thick graphite film and a 100 nm-thick silicon film. The calculated transmittance was 52% for the graphite film, and 86% for the silicon film. Likewise, the transmittance of a 6.75 nm wavelength light was calculated for each of a 100 nm-thick graphite film and a 100 nm-thick silicon film. The calculated transmittance was 84% for the graphite film, and 17% for the silicon film.

From these results, it became apparent that, when the thickness of the pellicle membrane composed of the graphite film is 100 nm, the light transmittance becomes 50% or more for both 13.5 nm light and 6.75 nm light and, therefore, the efficiency of EUV irradiation is favorable.

INDUSTRIAL APPLICABILITY

A pellicle of the present invention has high EUV transmittance. In addition, a pellicle membrane of the pellicle is insusceptible to thermal damage during EUV irradiation, and further is chemically stable to the EUV irradiation. Accordingly, the pellicle of the present invention is highly advantageous as a pellicle for securely protecting an original plate or an optical system for EUV lithography.

REFERENCE SIGNS LIST

10 Pellicle
12 Pellicle membrane
13 Film adhesive layer
14 Pellicle frame
15 Adhesive layer for original plate
16 Vent hole
20, 25 Filter window
31 EUV light source
32, 35, 36 Multilayer film mirror
33 Original Plate
34 Sensitive substrate
37 Illumination optical system
38 Projection optical system

The invention claimed is:
1. A pellicle comprising:
  a pellicle membrane having a refractive index n of 1.9 to 5.0 under light with a wavelength of 550 nm, and
  a pellicle frame to which the pellicle membrane is adhered,
  wherein:
  the pellicle membrane contains in its composition 30 to 100% by mole of carbon and 0 to 30% by mole of hydrogen, and
  in a Raman spectrum of the pellicle membrane, an intensity ratio between a 2D-band and a G-band (intensity of 2D-band / intensity of G-band) is 1 or less, or an intensity of each of the 2D-band and the G-band is 0.
2. The pellicle according to claim 1, wherein the pellicle membrane further contains 0 to 70% by mole of a third component selected from the group consisting of Si, B, N,

O, Y, Zr, Nb and Mo, and a total of the carbon, the hydrogen and the third component is 98% by mole or more.

3. The pellicle according to claim 2, comprising 40 to 60% by mole of Si as the third component.

4. The pellicle according to claim 2, wherein the pellicle membrane contains a polycrystalline silicon carbide film, and a density of the pellicle membrane is within a range of from 3.0 to 5.0 g/cm$^3$.

5. The pellicle according to claim 1, wherein the pellicle membrane contains at least one film selected from the group consisting of a diamond-like carbon film, an amorphous carbon film, a graphite film and a silicon carbide film.

6. The pellicle according to claim 1, wherein a thickness of the pellicle membrane is 10 to 120 nm.

7. The pellicle according to claim 1, wherein the pellicle membrane is obtained by imparting high energy to a polymer film.

8. The pellicle according to claim 7, wherein the polymer film is a polyimide film.

9. An EUV exposure device comprising an EUV light source, an optical system, and an original plate, wherein:
light from the EUV light source is guided to the original plate through the optical system, and
the pellicle according to claim 1 is provided on a light incidence surface of the original plate.

10. An exposure original plate comprising an original plate, and the pellicle according to claim 1 attached to the original plate.

11. An exposure method comprising:
irradiating EUV on the original plate by passing the EUV from an EUV light source through the pellicle membrane of the exposure original plate according to claim 10, and
passing through the pellicle membrane the EUV reflected by the original plate and irradiating a sensitive substrate with the EUV, to thereby expose the sensitive substrate in a pattern.

12. A pellicle comprising:
a pellicle membrane having a refractive index n of 1.9 to 5.0 under light with a wavelength of 550 nm, and
a pellicle frame to which the pellicle membrane is adhered,
wherein:
the pellicle membrane contains in its composition 30 to 100% by mole of carbon, 0 to 30% by mole of hydrogen, and 0 to 70% by mole of a third component selected from the group consisting of Si, B, N, O, Y, Zr, Nb and Mo, a total of the carbon, the hydrogen and the third component being 98% by mole or more,
in a Raman spectrum of the pellicle membrane, an intensity ratio between a 2D-band and a G-band (intensity of 2D-band / intensity of G-band) is 1 or less, or an intensity of each of the 2D-band and the G-band is 0, and
the pellicle membrane contains at least one film selected from the group consisting of a diamond-like carbon film, an amorphous carbon film, a graphite film and a silicon carbide film.

13. A pellicle comprising:
a pellicle membrane having a refractive index n of 1.9 to 5.0 under light with a wavelength of 550 nm, and
a pellicle frame to which the pellicle membrane is adhered,
wherein:
the pellicle membrane contains in its composition 30 to 100% by mole of carbon, 0 to 30% by mole of hydrogen, and 0 to 70% by mole of a third component selected from the group consisting of Si, B, N, O, Y, Zr, Nb and Mo, a total of the carbon, the hydrogen and the third component being 98% by mole or more,
in a Raman spectrum of the pellicle membrane, an intensity ratio between a 2D-band and a G-band (intensity of 2D-band / intensity of G-band) is 1 or less, or an intensity of each of the 2D-band and the G-band is 0,
the pellicle membrane contains at least one film selected from the group consisting of a diamond-like carbon film, an amorphous carbon film, a graphite film and a silicon carbide film, and
the pellicle membrane is obtained by imparting high energy to a polymer film.

14. The pellicle according to claim 13, wherein the polymer film is a polyimide film.

* * * * *